US012068340B2

(12) United States Patent
Moon et al.

(10) Patent No.: US 12,068,340 B2
(45) Date of Patent: Aug. 20, 2024

(54) IMAGE SENSOR COMPRISING AN INTER-PIXEL OVERFLOW (IPO) BARRIER AND ELECTRONIC SYSTEM INCLUDING THE SAME

(71) Applicant: SAMSUNG ELECTRONICS CO., LTD., Suwon-si (KR)

(72) Inventors: Sanghyuck Moon, Gwangju (KR); Kyungho Lee, Suwon-si (KR); Seungjoon Lee, Busan (KR); Minji Jung, Hwaseong-si (KR); Masato Fujita, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 424 days.

(21) Appl. No.: 17/345,284

(22) Filed: Jun. 11, 2021

(65) Prior Publication Data

US 2022/0109012 A1  Apr. 7, 2022

(30) Foreign Application Priority Data

Oct. 5, 2020 (KR) .......................... 10-2020-0128267

(51) Int. Cl.
*H01L 27/146* (2006.01)

(52) U.S. Cl.
CPC .... *H01L 27/1461* (2013.01); *H01L 27/14603* (2013.01); *H01L 27/14621* (2013.01); *H01L 27/14627* (2013.01); *H01L 27/1463* (2013.01); *H01L 27/1464* (2013.01); *H01L 27/14641* (2013.01); *H01L 27/14645* (2013.01)

(58) Field of Classification Search
CPC .......... H01L 27/14603; H01L 27/1461; H01L 27/14612; H01L 27/14627; H01L 27/1463; H01L 27/1464; H01L 27/14641; H01L 27/14645
See application file for complete search history.

(56) References Cited

U.S. PATENT DOCUMENTS

| 9,123,603 | B2 | 9/2015 | Kobayashi et al. |
|---|---|---|---|
| 9,224,776 | B2 | 12/2015 | Okuzawa et al. |
| 9,911,777 | B2 | 3/2018 | Lee et al. |
| 10,347,679 | B2 | 7/2019 | Kato et al. |
| 10,424,613 | B2 | 9/2019 | Tsuboi et al. |
| 10,431,619 | B2 | 10/2019 | Masagaki et al. |
| 2014/0054662 | A1* | 2/2014 | Yanagita ........... H01L 27/14645 438/73 |
| 2019/0131328 | A1 | 5/2019 | Kim et al. |
| 2020/0344433 | A1* | 10/2020 | Fujita ................. H01L 27/1464 |

* cited by examiner

*Primary Examiner* — Herve-Louis Y Assouman
*Assistant Examiner* — Christopher M Roland
(74) *Attorney, Agent, or Firm* — Fish & Richardson P.C.

(57) ABSTRACT

An image sensor includes a substrate having a sensing area, a floating diffusion region arranged in the sensing area, a plurality of photodiodes arranged around the floating diffusion region in the sensing area, and an inter-pixel overflow (IPO) barrier in contact with each of the plurality of photodiodes, the IPO barrier overlapping the floating diffusion region in a vertical direction at a position vertically spaced apart from the floating diffusion region within the sensing area.

20 Claims, 35 Drawing Sheets

IMAGE SENSOR COMPRISING AN INTER-PIXEL OVERFLOW (IPO) BARRIER AND ELECTRONIC SYSTEM INCLUDING THE SAME

CROSS-REFERENCE TO RELATED APPLICATION

A claim of priority under 35 U.S.C. § 119 is made to Korean Patent Application No. 10-2020-0128267, filed on Oct. 5, 2020, in the Korean Intellectual Property Office, the entirety of which is incorporated by reference.

BACKGROUND

The present disclosure relates to image sensors and electronic systems including the image sensors, and more particularly to image sensors including a plurality of photodiodes and electronic systems including the image sensors.

With the development of the computer industry and the communication industry, image sensors that acquire images and convert the acquired images into electrical signals have been used in various fields such as digital cameras, camcorders, personal communication systems (PCS), game devices, security cameras, and medical micro cameras. As image sensors have become highly integrated and pixel sizes miniaturized, shared pixel structures have been employed in image sensors. There is a need for image sensors having structure that may be obtained through a simplified process while securing stable electrical characteristics required in a shared pixel structure.

SUMMARY

Embodiments of the inventive concepts provide an image sensor having a structure that may be obtained through a simplified process while securing stable electrical characteristics required in a shared pixel structure.

Embodiments of the inventive concepts also provide an electronic system including an image sensor having a structure that may be obtained through a simplified process while securing stable electrical characteristics required in a shared pixel structure.

Embodiments of the inventive concepts provide an image sensor including a substrate having a sensing area; a floating diffusion region arranged in the sensing area; a plurality of photodiodes arranged around the floating diffusion region in the sensing area; and an inter-pixel overflow (IPO) barrier in contact with each of the plurality of photodiodes, the IPO barrier overlapping the floating diffusion region in a vertical direction at a position vertically spaced apart from the floating diffusion region within the sensing area.

Embodiments of the inventive concepts also provide an image sensor including a substrate having a front side surface and a back side surface that are opposite each other, and a sensing area between the front side surface and the back side surface; a floating diffusion region arranged adjacent to the front side surface in the sensing area; a plurality of transfer gates arranged around the floating diffusion region in the sensing area; a plurality of channel regions located under the plurality of transfer gates in the sensing area; a plurality of photodiodes arranged in the sensing area around the floating diffusion region, and adjacent to the front side surface, the plurality of photodiodes spaced apart from the floating diffusion region, and the plurality of channel regions arranged between the plurality of photodiodes and the floating diffusion region; an inter-pixel overflow (IPO) barrier arranged at a position vertically spaced apart from the floating diffusion region within the sensing area and overlapping the floating diffusion region in a vertical direction, the IPO barrier having a plurality of contact surfaces respectively in contact with the plurality of photodiodes; and a microlens covering the back side surface.

Embodiments of the inventive concepts further provide an electronic system including at least one camera module including an image sensor; and a processor configured to process image data provided from the at least one camera module. The image sensor includes a substrate having a sensing area; a floating diffusion region arranged in the sensing area; a plurality of photodiodes arranged around the floating diffusion region in the sensing area; and an inter-pixel overflow (IPO) barrier in contact with each of the plurality of photodiodes, the IPO barrier overlapping the floating diffusion region in a vertical direction at a position vertically spaced apart from the floating diffusion region within the sensing area.

Embodiments of the inventive concepts still further provide an image sensor including a substrate having a front side surface and a back side surface opposite the front side surface, and a sensing area between the front and back side surfaces; a floating diffusion region in the sensing area adjacent the front side surface; a plurality of photodiodes in the sensing area arranged around and spaced apart from the floating diffusion region, each of the plurality of photodiodes including a first semiconductor region having first conductivity type that is adjacent the front side surface, and a second semiconductor region having second conductivity type in contact with the first semiconductor region, the first semiconductor region disposed between the front side surface and the second semiconductor region; and an inter-pixel overflow (IPO) barrier having the second conductivity type, arranged in the sensing area between the front and back side surfaces and spaced apart from the floating diffusion region, and in contact with the second semiconductor region of each of the plurality of photodiodes.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
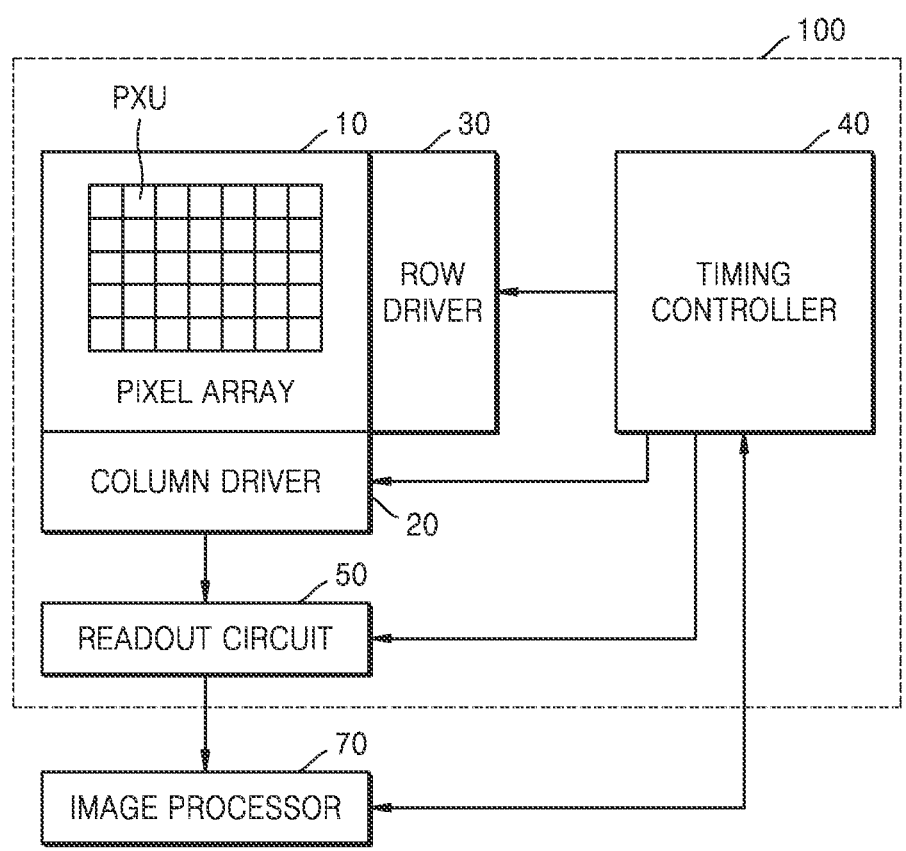
FIG. 1 illustrates a block diagram of an image sensor according to embodiments of the inventive concepts.

Hereinafter, embodiments of the inventive concept will be described in detail with reference to the accompanying drawings. Like reference numerals in the accompanying drawings refer to like elements throughout, and duplicate descriptions thereof are omitted.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a block diagram of an image sensor 100 according to embodiments of the inventive concepts.

Referring to FIG. 1, the image sensor 100 according to embodiments of the inventive concepts may include a pixel array 10 and circuits for controlling the pixel array 10. In example embodiments, the circuits for controlling the pixel array 10 may include a column driver 20, a row driver 30, a timing controller 40, and a readout circuit 50.

The image sensor 100 may operate according to a control command received from an image processor 70, and may convert light transmitted from an external object into an electrical signal and output the electrical signal to the image processor 70. The image sensor 100 may be a complementary metal-oxide semiconductor (CMOS) image sensor.

The pixel array 10 may include a plurality of pixel units PXU having a two-dimensional array structure arranged in a matrix form along a plurality of row lines and a plurality of column lines. The term "row" as used herein refers to a set of a plurality of unit pixels arranged in a horizontal direction from among a plurality of unit pixels included in the pixel array 10, and the term "column" as used herein refers to a set of a plurality of unit pixels arranged in a vertical direction from among the plurality of unit pixels included in the pixel array 10.

Each of the plurality of pixel units PXU may have a multi-pixel structure including a plurality of photodiodes. In each of the plurality of pixel units PXU, a plurality of photodiodes may generate electric charges by receiving light transmitted from the object. The image sensor 100 may perform an autofocus function by using a phase difference between pixel signals generated from the plurality of photodiodes included in each of the plurality of pixel units PXU. Each of the plurality of pixel units PXU may include a pixel circuit for generating a pixel signal from electric charges generated by the plurality of photodiodes.

The column driver 20 may include a correlated double sampler (CDS), an analog-to-digital converter (ADC), and the like. The CDS may be connected, through column lines, to a pixel unit PXU included in a row selected by a row selection signal supplied by the row driver 30 and perform correlated double sampling to detect a reset voltage and a pixel voltage. The analog-to-digital converter may convert the reset voltage and the pixel voltage each detected by the CDS into digital signals and transmit the digital signals to the readout circuit 50.

The readout circuit 50 may include a latch or buffer circuit, which is capable of temporarily storing digital signals, an amplifying circuit, and the like, and may temporarily store or amplify digital signals received from the column driver 20 to generate image data. The operation timing of the column driver 20, the row driver 30, and the readout circuit 50 may be determined by the timing controller 40, and the timing controller 40 may operate based on a control command transmitted from the image processor 70.

The image processor 70 may signal-process image data output from the readout circuit 50 and output the signal-processed image data to a display device or store the signal-processed image data in a storage device such as a memory. For example, when the image sensor 100 is mounted on an autonomous vehicle, the image processor 70 may signal-process image data and transmit the signal-processed image data to a main controller that controls the autonomous vehicle.

Figure 2:
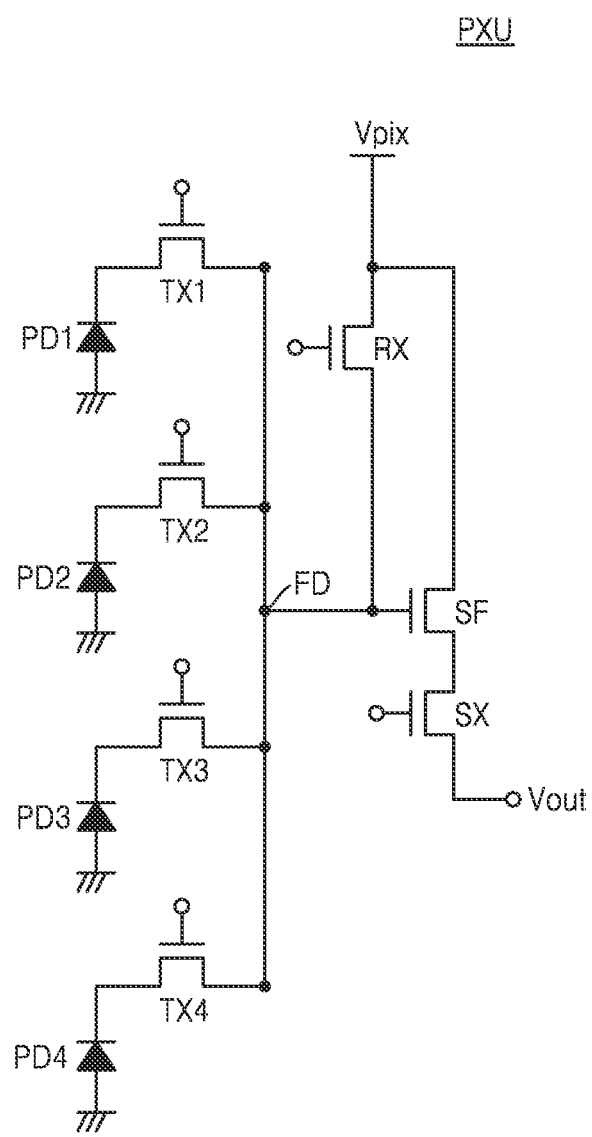
FIG. 2 illustrates an example circuit diagram of a pixel unit included in an image sensor according to embodiments of the inventive concepts.
Figure 3A:
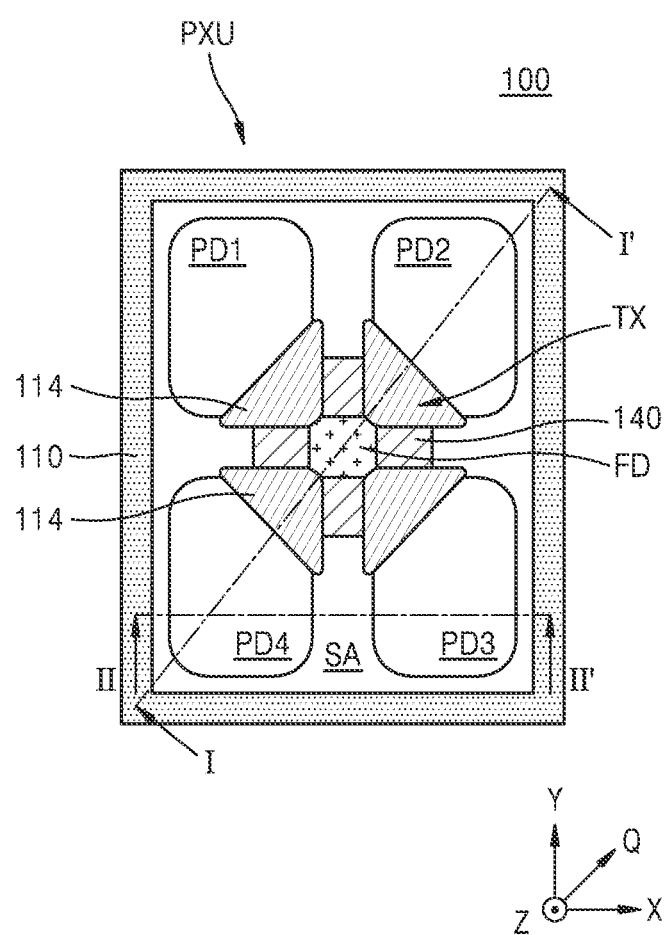
FIG. 3A illustrates a schematic plan view of a partial configuration of an image sensor according to embodiments of the inventive concepts.
Figure 3B:
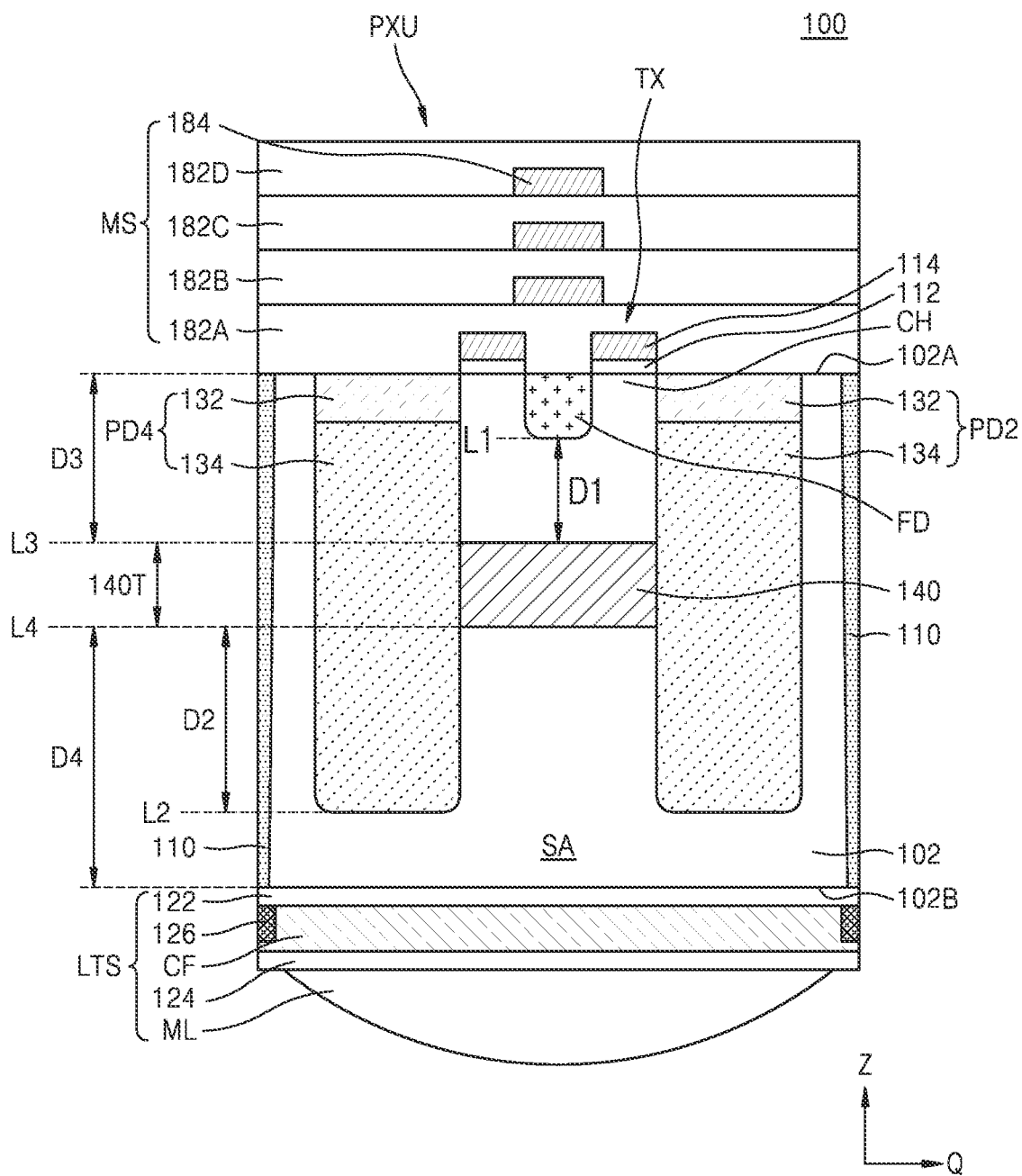
FIG. 3B illustrates a cross-sectional view taken along line I-I' of FIG. 3A.
Figure 3C:
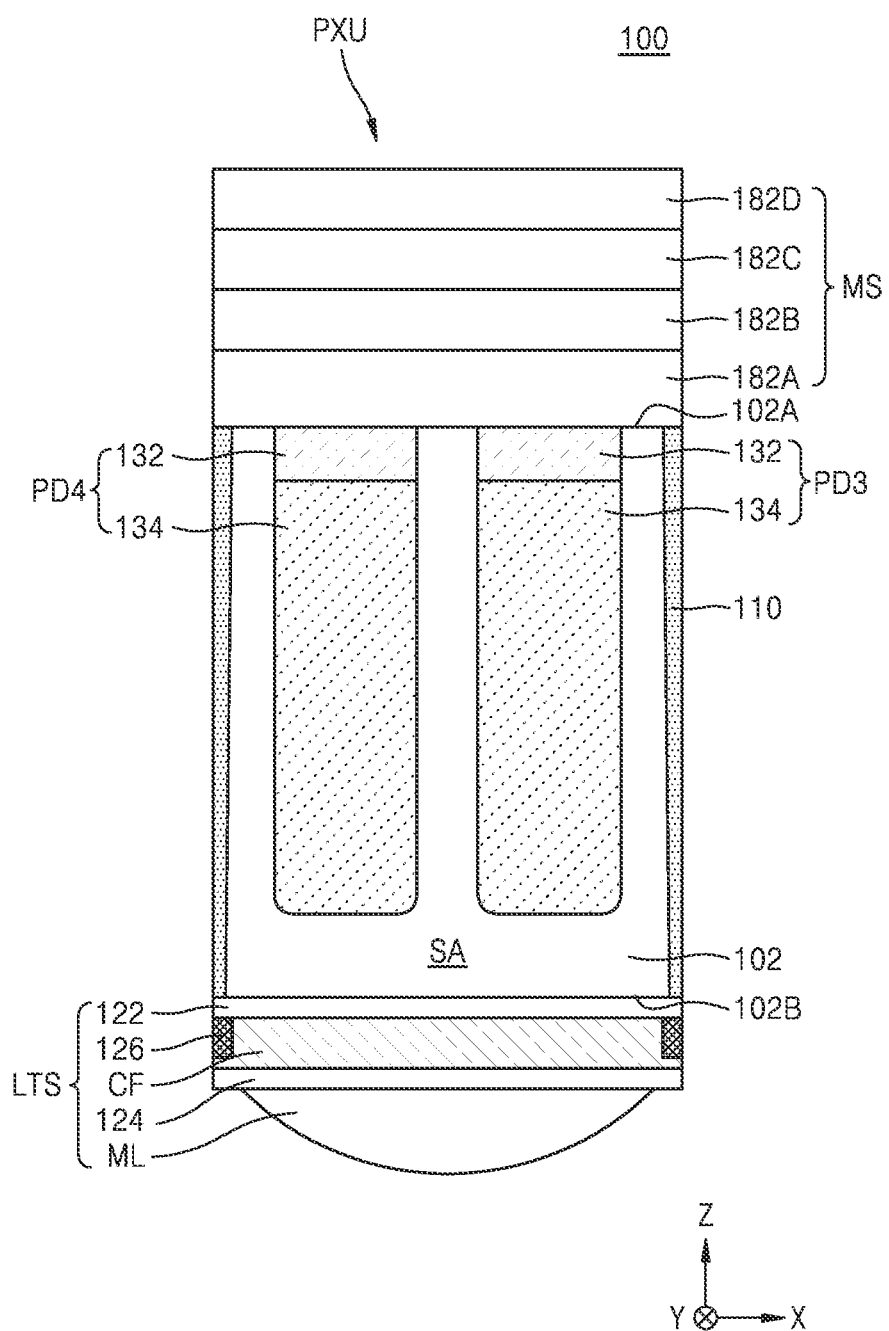
FIG. 3C illustrates a cross-sectional view taken along line II-II' of FIG. 3A.
Figure 3D:
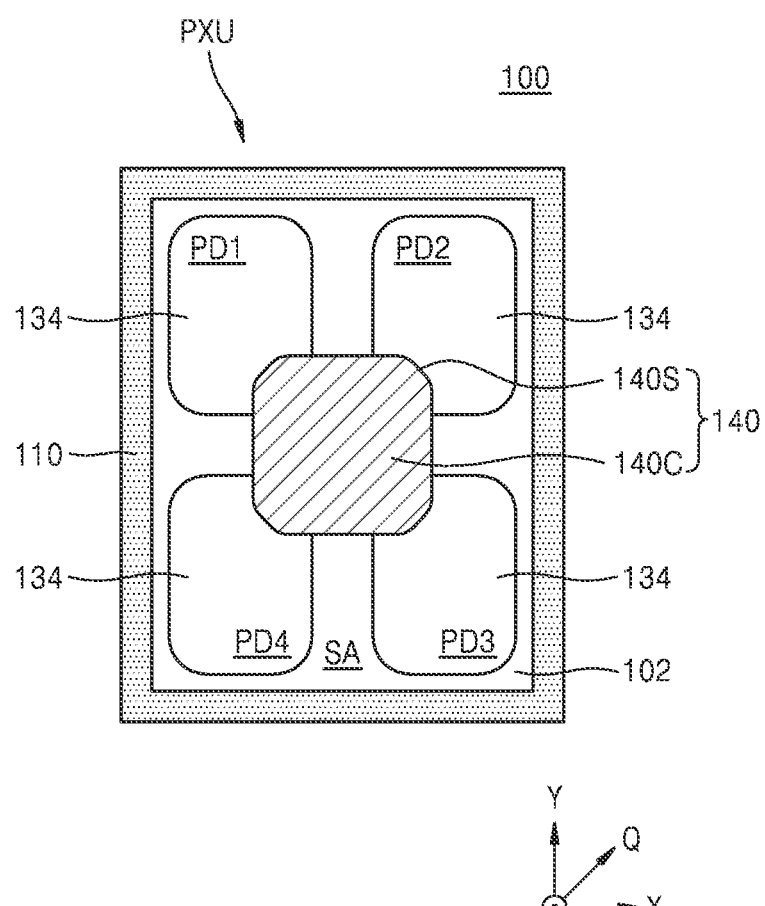
FIG. 3D illustrates a plan layout of some components of the image sensor illustrated in FIG. 3A.

FIG. 2 illustrates an example circuit diagram of a pixel unit PXU included in the image sensor 100 according to embodiments of the inventive concepts. FIGS. 3A to 3D illustrate views explanatory of the configuration of the image sensor 100 in greater detail. FIG. 3A illustrates a schematic plan view of a partial configuration of the image sensor 100. FIG. 3B illustrates a cross-sectional view taken along line I-I' of FIG. 3A. FIG. 3C illustrates a cross-sectional view taken along line II-II0 included in. FIG. 3D illustrates a plan layout of some components of the image sensor 100 illustrated in FIG. 3A. An example configuration of the pixel unit PXU illustrated in FIG. 1 will be described with reference to FIGS. 2 and 3A to 3D.

Referring to FIGS. 2 and 3A to 3D, the image sensor 100 includes a pixel unit PXU having a sensing area SA defined by a device isolation structure 110. The pixel unit PXU may constitute a 4-shared pixel including four photodiodes formed in a substrate 102, that is, first to fourth photodiodes PD1, PD2, PD3, and PD4. Each of the first to fourth photodiodes PD1, PD2, PD3, and PD4 in the pixel unit PXU may constitute one pixel. In one pixel unit PXU, the first to fourth photodiodes PD1, PD2, PD3, and PD4 may share one floating diffusion region FD. The first to fourth photodiodes PD1, PD2, PD3, and PD4 may be arranged around the floating diffusion region FD in the sensing area SA. The first to fourth photodiodes PD1, PD2, PD3, and PD4 may be arranged radially outside the floating diffusion region FD to surround the floating diffusion region FD.

In the pixel unit PXU, the first to fourth photodiodes PD1, PD2, PD3, and PD4 may share one floating diffusion region FD through first to fourth transfer transistors TX1, TX2, TX3, and TX4 corresponding to the first to fourth photodiodes PD1, PD2, PD3, and PD4. That is, the first transfer transistor TX1 corresponding to the first photodiode PD1, the second transfer transistor TX2 corresponding to the second photodiode PD2, the third transfer transistor TX3 corresponding to the third photodiode PD3, and the fourth transfer transistor TX4 corresponding to the fourth photodiode PD4 may share one floating diffusion region FD as a common drain region.

As illustrated in FIG. 2, in one pixel unit PXU, the first to fourth photodiodes PD1, PD2, PD3, and PD4 may share a reset transistor RX, a source follower transistor SF, and a selection transistor SX. The reset transistor RX, the source follower transistor SF, and the selection transistor SX may be arranged in a row direction or a column direction around the sensing area SA (refer to FIGS. 3A to 3D) included in the pixel unit PXU.

As illustrated in FIG. 2, the first to fourth photodiodes PD1, PD2, PD3, and PD4 may respectively constitute source regions of the first to fourth transfer transistors TX1, TX2, TX3, and TX4 corresponding thereto. The floating diffusion region FD may constitute a common drain region of the first to fourth transfer transistors TX1, TX2, TX3, and TX4. The floating diffusion region FD may be connected to a source region of the reset transistor RX and a gate electrode of the source follower transistor SF. A drain region of the reset transistor RX and a drain region of the source follower transistor SF may be shared and connected to a line of a power supply voltage Vpix. A source region of the source follower transistor SF and a drain region of the selection transistor SX may be shared with each other. An output voltage Vout may be provided from a source region of the selection transistor SX.

The floating diffusion region FD may be periodically reset by the reset transistor RX. When the reset transistor RX is turned on by a reset signal, the power supply voltage Vpix supplied to the drain region of the reset transistor RX may be transferred to the floating diffusion region FD, and accordingly, the floating diffusion region FD may be reset.

The source follower transistor SF may serve as a source follower buffer amplifier and may amplify a change in electrical potential of the floating diffusion region FD.

Although FIGS. 2 and 3A to 3D show an example in which the pixel unit PXU included in the image sensor 100 constitutes a 4-shared pixel including the first to fourth photodiodes PD1, PD2, PD3, and PD4, the inventive concepts are not limited thereto. The pixel unit PXU according to the inventive concepts may constitute an N-shared pixel including N (N is an integer of 2 or more) photodiodes. For example, each of the plurality of pixel units PXU included in the image sensor 100 may include a 2-shared pixel including two photodiodes or an 8-shared pixel including eight photodiodes.

The image sensor 100 according to embodiments of the inventive concepts may detect a reset voltage and a pixel voltage from each of the pixel units PXU each having the circuit configuration illustrated in FIG. 2 and obtain a pixel signal by calculating a difference between the reset voltage and the pixel voltage. The pixel voltage may be a voltage reflecting electric charges generated by the first to fourth photodiodes PD1, PD2, PD3, and PD4 included in each of the plurality of pixel units PXU illustrated in FIG. 1.

Referring to FIGS. 3A to 3D, in the image sensor 100, the pixel unit PXU may include a device isolation structure 110 formed in the substrate 102 and a sensing area SA defined by the device isolation structure 110. The sensing area SA may be an area for sensing light incident from the outside of the pixel unit PXU.

The substrate 102 may include a semiconductor layer. In example embodiments, the substrate 102 may include a semiconductor layer doped with P-type impurities. For example, the substrate 102 may include a semiconductor layer including Si, Ge, SiGe, a group II-VI compound semiconductor, a group III-V compound semiconductor, or a combination thereof, or a silicon on insulator (SOI) substrate. In example embodiments, the substrate 102 may include a P-type epitaxial semiconductor layer epitaxially grown from a P-type bulk silicon substrate. The substrate 102 may have a front side surface 102A and a back side surface 102B that are opposite surfaces.

A wiring structure MS may be arranged on the front side surface 102A of the substrate 102. The wiring structure MS may include interlayer insulating layers 182A, 182B, 182C, and 182D of a multilayer structure covering the first to fourth transfer transistors TX1, TX2, TX3, and TX4, and a plurality of wiring layers 184 of a multilayer structure formed on each of the interlayer insulating layers 182A, 182B, 182C, and 182D. The number and arrangement of the interlayer insulating layers 182A, 182B, 182C, and 182D and the number and arrangement of the plurality of wiring layers 184 are not limited to those illustrated in FIGS. 3B and 3C, and various changes and modifications may be made as necessary.

The plurality of wiring layers 184 in the wiring structure MS may include a plurality of transistors electrically connected to the first to fourth photodiodes PD1, PD2, PD3, and PD4, and wirings connected to the plurality of transistors. The plurality of transistors may include the first to fourth transfer transistors TX1, TX2, TX3, and TX4, the reset transistor RX, the source follower transistor SF, and the selection transistor SX, which are illustrated in FIG. 2. Electrical signals converted by the first to fourth photodiodes PD1, PD2, PD3, and PD4 may be signal-processed by the wiring structure MS. The arrangement of the plurality of wiring layers 184 may be freely changed irrespective of the arrangement of the first to fourth photodiodes PD1, PD2, PD3, and PD4.

A light-transmitting structure LTS may be arranged on the back side surface 102B of the substrate 102. The light-transmitting structure LTS may include a first planarization layer 122, a color filter CF, a second planarization layer 124, and a microlens ML sequentially stacked on the back side surface 102B. The light-transmitting structure LTS may condense and filter light incident from the outside and provide the condensed and filtered light to the sensing area SA. The first to fourth photodiodes PD1, PD2, PD3, and PD4 in one sensing area SA may be covered by one microlens ML. The pixel unit PXU may have a back side illumination (BSI) structure that receives light from the back side surface 102B of the substrate 102.

In the light-transmitting structure LTS, the first planarization layer 122 may be used as a buffer layer to prevent damage to the substrate 102 during a process of manufacturing the image sensor 100. The first planarization layer 122 and the second planarization layer 124 may each include for example a silicon oxide layer, a silicon nitride layer, a resin, or a combination thereof, but are not limited thereto.

In example embodiments, the color filter CF may include a red color filter, a green color filter, a blue color filter, or a white color filter. The white color filter may be a transparent color filter that transmits light in a visible wavelength band. The pixel array 10 illustrated in FIG. 1 may include a plurality of color filter groups in which a red color filter, a green color filter, a blue color filter, and a white color filter are arranged in a two-dimensional array of 2×2 to form one color filter group. The plurality of color filter groups may be arranged in a matrix form along a plurality of row lines and a plurality of column lines. In other example embodiments, the color filter CF may have another color such as cyan, magenta, or yellow.

The microlens ML may have an outwardly convex shape to condense light incident on the first to fourth photodiodes PD1, PD2, PD3, and PD4.

The light-transmitting structure LTS may further include an anti-reflection layer 126 formed on the first planarization layer 122. The anti-reflection layer 126 may be arranged at a position overlapping the device isolation structure 110 in a vertical direction (Z direction) on an edge portion of the sensing area SA. The top surface and sidewalls of the anti-reflection layer 126 may be covered by a color filter CF. The anti-reflection layer 126 may prevent incident light passing through the color filter CF from being laterally reflected or scattered. For example, the anti-reflection layer 126 may prevent photons reflected or scattered at the interface between the color filter CF and the first planarization layer 122 from moving to another sensing area. The anti-reflection layer 126 may include a metal. For example, the anti-reflection layer 126 may include tungsten (W), aluminum (Al), copper (Cu), or a combination thereof.

The first to fourth transfer transistors TX1, TX2, TX3, and TX4 included in one pixel unit PXU may each include a gate dielectric layer 112, a transfer gate 114, and a channel region CH. The channel region CH may be arranged adjacent to the gate dielectric layer 112 of the substrate 102.

The first to fourth transfer transistors TX1, TX2, TX3, and TX4, the first to fourth photodiodes PD1, PD2, PD3, and PD4, and the floating diffusion region FD may be arranged in the sensing area SA of the pixel unit PXU. The first to fourth photodiodes PD1, PD2, PD3, and PD4 may respectively correspond to source regions of the first to fourth transfer transistors TX1, TX2, TX3, and TX4, and the floating diffusion region FD may correspond to a drain region of each of the first to fourth transfer transistors TX1, TX2, TX3, and TX4.

Each of the first to fourth photodiodes PD1, PD2, PD3, and PD4 may include a first semiconductor region 132, a second semiconductor region 134, and a junction between the first semiconductor region 132 and the second semiconductor region 134. The first semiconductor region 132 may be a semiconductor region doped with P-type impurities, and may be arranged adjacent to the front side surface 102A of the substrate 102. The first semiconductor region 132 may be used as a hole accumulated device (HAD) region. An impurity concentration in the first semiconductor region 132 may be greater than an impurity concentration in a P-type semiconductor layer constituting the substrate 102. The second semiconductor region 134 may be a semiconductor region doped with N-type impurities, and contact the first semiconductor region 132 at a position spaced apart from the front side surface 102A of the substrate 102 with the first semiconductor region 132 therebetween.

The transfer gate 114 of each of the first to fourth transfer transistors TX1, TX2, TX3, and TX4 may transfer, to the floating diffusion region FD, photocharges generated by each of the first to fourth photodiodes PD1, PD2, PD3, and PD4. In the present example, the transfer gate 114 of each of the first to fourth transfer transistors TX1, TX2, TX3, and TX4 has a planar type gate structure, and each of the first to fourth transfer transistors TX1, TX2, TX3, and TX4 has a planar channel transistor structure. However, the inventive concepts are not limited thereto. For example, at least a portion of the transfer gate 114 may be buried in the substrate 102 from the front side surface 102A of the substrate 102, and each of the first to fourth transfer transistors TX1, TX2, TX3, and TX4 may have a recess channel transistor structure.

In the sensing area SA of the pixel unit PXU, an inter-pixel overflow (IPO) barrier 140 may be arranged at a position overlapping the floating diffusion region FD in the vertical direction (Z direction). The IPO barrier 140 may contact the second semiconductor region 134 of each of the first to fourth photodiodes PD1, PD2, PD3, and PD4. In example embodiments, as illustrated in FIG. 3A, in a plan view, the center of the IPO barrier 140 may approximately coincide (i.e., is aligned in the vertical direction) with the center of the floating diffusion region FD. In example embodiments, the IPO barrier 140 may have a plurality of contact surfaces in contact with the second semiconductor region 134 of each of the first to fourth photodiodes PD1, PD2, PD3, and PD4, and the areas of the plurality of contact surfaces may be approximately the same or similar to each other.

The IPO barrier 140 may include a semiconductor region doped with impurities of the same conductivity type as the second semiconductor region 134 of each of the first to fourth photodiodes PD1, PD2, PD3, and PD4. For example, the IPO barrier 140 may include a third semiconductor region doped with N-type impurities. In example embodiments, an impurity doping concentration in the second semiconductor region 134 may be substantially the same as or similar to an impurity doping concentration in the IPO barrier 140. In other example embodiments, the impurity doping concentration in the second semiconductor region 134 may be greater than the impurity doping concentration in the IPO barrier 140. For example, the impurity doping concentration in the second semiconductor region 134 may be selected within the range of about $1\times10^{11}/cm^3$ to about $1\times10^{13}/cm^3$, and the impurity doping concentration in the IPO barrier 140 may be selected within the range of about $1\times10^9/cm^3$ to about $1\times10^{12}/cm^3$. However, the inventive concepts are not limited thereto.

The IPO barrier 140 may be arranged at a position spaced apart from the front side surface 102A and the back side surface 102B of the substrate 102. The IPO barrier 140 may be arranged at a position spaced apart from the device isolation structure 110 with one selected from the first to fourth photodiodes PD1, PD2, PD3, and PD4 therebetween. In example embodiments, surfaces of the substrate 102, for example, the front side surface 102A, the back side surface 102B, and surfaces that are in contact with the device isolation structure 110 may be exposed to an etching atmosphere during a process of manufacturing the image sensor 100, thereby causing a defect due to damage. When the IPO barrier 140 is arranged to contact a damaged surface of the substrate 102, problems such as the occurrence of charge transfer failure or dark current may occur. Accordingly, in order to avoid such problems, the IPO barrier 140 may be arranged at a position spaced apart from the surfaces of the substrate 102.

The IPO barrier 140 may be arranged at a position spaced apart from the transfer gate 114 of each of the first to fourth transfer transistors TX1, TX2, TX3, and TX4 in the vertical direction (Z direction) with the floating diffusion region FD therebetween. The IPO barrier 140 may include portions overlapping each of the first to fourth transfer transistors TX1, TX2, TX3, and TX4 in the vertical direction (Z direction).

The IPO barrier 140 may provide an electron movement path between each of the first to fourth photodiodes PD1, PD2, PD3, and PD4. When a full well capacity (FWC) in one of the first to fourth photodiodes PD1, PD2, PD3, and PD4 is exceeded when signal charges are accumulated in the first to fourth photodiodes PD1, PD2, PD3, and PD4, the IPO barrier 140 may provide an electron movement path for flowing an excess charge amount to another of the first to fourth photodiodes PD1, PD2, PD3, and PD4. Therefore, electrons of light received in the sensing area SA may not be affected by the spatial limit of the first to fourth photodiodes PD1, PD2, PD3, and PD4 and may be accumulated in the first to fourth photodiodes PD1, PD2, PD3, and PD4 each having an FWC increased by the IPO barrier 140.

The potential of the channel region CH of each of the first to fourth transfer transistors TX1, TX2, TX3, and TX4 may be changed according to a voltage applied to the transfer gate 114 of each of the first to fourth transfer transistors TX1, TX2, TX3, and TX4. When a certain voltage is applied to the transfer gate 114 of each of the first to fourth transfer transistors TX1, TX2, TX3, and TX4 after signal charges are accumulated in the second semiconductor region 134 of each of the first to fourth photodiodes PD1, PD2, PD3, and PD4, signal charges in the second semiconductor region 134 and the IPO barrier 140 may be transferred to the floating diffusion region FD through the channel region CH.

For example, when light is excessively introduced into the first photodiode PD1 among the first to fourth photodiodes PD1, PD2, PD3, and PD4 in the pixel unit PXU, some of the electric charges generated by the first photodiode PD1 may move, through the IPO barrier 140, to at least one photodiode selected from the second to fourth photodiodes PD2, PD3, and PD4. Accordingly, local saturation of the first to fourth photodiodes PD1, PD2, PD3, and PD4 may be prevented by the IPO barrier 140, and under various operating environments of the image sensor 100, the FWC of electrons obtained from the first to fourth photodiodes PD1, PD2, PD3, and PD4 may be increased without being affected by the spatial limit of the photodiodes PD1, PD2, PD3, and PD4. Therefore, even though the size of the pixel unit PXU of the image sensor 100 is reduced, an FWC in the first to fourth photodiodes PD1, PD2, PD3, and PD4 may be increased, and excellent sensitivity and color quality may be provided.

The IPO barrier 140 may be arranged at a level that is selected between a first vertical level L1 and a second vertical level L2 and spaced apart from the first vertical level L1 in the vertical direction (Z direction). The first vertical level L1 is the bottommost level of the floating diffusion region FD, which is the closest to the microlens ML, and the second vertical level L2 is the bottommost level of each of the first to fourth photodiodes PD1, PD2, PD3, and PD4, which is the closest to the microlens ML. In example embodiments, as illustrated in FIG. 3B, in the vertical direction (Z direction), a minimum separation distance D1 between the first vertical level L1, which is the bottommost level of the floating diffusion region FD, and a topmost level L3 of the IPO barrier 140 may be less than a minimum separation distance D2 between the second vertical level L2, which is the bottommost level of each of the first to fourth photodiodes PD1, PD2, PD3, and PD4, and a bottommost level L4 of the IPO barrier 140. In example embodiments, a vertical direction (Z direction) minimum separation distance D3 between the front side surface 102A of the substrate 102 and the IPO barrier 140 may be less than a vertical direction (Z direction) minimum separation distance D4 between the IPO barrier 140 and the back side surface 102B of the substrate 102.

A plan layout including the first to fourth photodiodes PD1, PD2, PD3, and PD4 and the IPO barrier 140 illustrated in FIG. 3D may correspond to a plan layout at a level between the topmost level L3 and the bottommost level L4 of the IPO barrier 140 in FIG. 3B. The IPO barrier 140 may be in contact with the second semiconductor region 134 of each of the first to fourth photodiodes PD1, PD2, PD3, and PD4 at a level between the topmost level L3 and the bottommost level L4 of the IPO barrier 140.

As illustrated in FIG. 3D, the IPO barrier 140 may include an IPO barrier center portion 140C arranged in an approximately central portion of the sensing area SA, and a convex contact surface 140S in contact with the first to fourth photodiodes PD1, PD2, PD3, and PD4.

In example embodiments, in order to manufacture the image sensor 100 illustrated in FIGS. 3A to 3D, an ion implantation process for forming the first to fourth photodiodes PD1, PD2, PD3, and PD4 in the substrate 102 may be first performed to thereby form first to fourth ion implantation regions, and then an ion implantation process for forming the IPO barrier 140 may be performed on a region including regions overlapping partial regions of each of the first to fourth ion implantation regions in an approximately central portion of the sensing area SA. Regions remaining in the substrate 102 from among the first to fourth ion implantation regions after the IPO barrier 140 is formed may constitute the first to fourth photodiodes PD1, PD2, PD3, and PD4.

A thickness 140T of the IPO barrier 140 in the vertical direction (Z direction) may be variously selected within a range greater than 0 and less than the thickness of the second semiconductor region 134 in the vertical direction (Z direction).

In the sensing area SA of the pixel unit PXU, the first to fourth photodiodes PD1, PD2, PD3, and PD4, the first to fourth transfer transistors TX1, TX2, TX3, and TX4, the floating diffusion region FD, and the IPO barrier 140 may vertically overlap one micro lens ML. First to fourth pixel signals may be generated from the first to fourth photodiodes PD1, PD2, PD3, and PD4. The first to fourth photodiodes PD1, PD2, PD3, and PD4 may generate photocharges by receiving light, which has passed through one microlens ML covering the backside surface 102B of the substrate 102, at different positions in the pixel unit PXU, and as the generated photocharges are accumulated in the first to fourth photodiodes PD1, PD2, PD3, and PD4, the first to fourth pixel signals may be generated. Auto-focusing information may be extracted from the first to fourth pixel signals output from the first to fourth photodiodes PD1, PD2, PD3, and PD4 in the pixel unit PXU.

The device isolation structure 110 may have a planar structure in a closed loop shape surrounding the first to fourth photodiodes PD1, PD2, PD3, and PD4, the first to fourth transfer transistors TX1, TX2, TX3, and TX4, the floating diffusion region FD, and the IPO barrier 140. The device isolation structure 110 may extend from the front side surface 102A of the substrate 102 to the back side surface 102B of the substrate 102 in a thickness direction of the substrate 102. In example embodiments, the device isolation structure 110 may include for example silicon oxide, silicon nitride, SiCN, SiON, SiOC, polysilicon, metal, metal nitride, metal oxide, borosilicate glass (BSG), phosphosilicate glass (PSG), borophosphosilicate glass (BPSG), plasma enhanced tetraethyl orthosilicate (PE-TEOS), fluoride silicate glass (FSG), carbon doped silicon oxide (CDO), organosilicate glass (OSG), air, or a combination thereof. Herein, the term "air" may refer to other gases that may be in the atmosphere or during a manufacturing process. For example, tungsten (W), copper (Cu), or a combination thereof may be provided as a metal that may be included in the device isolation structure 110. As a metal nitride that may be included in the device isolation structure 110, TiN, TaN, or a combination thereof may be provided. As a metal oxide that may be included in the device isolation structure 110, indium tin oxide (ITO), aluminum oxide ($Al_2O_3$), or a combination thereof may be provided.

The image sensor 100 described with reference to FIGS. 1, 2, and 3A to 3D includes the IPO barrier 140 connected to each of the first to fourth photodiodes PD1, PD2, PD3, and PD4 in the sensing area SA of the pixel unit PXU. The IPO barrier 140 overlaps the floating diffusion region FD in the vertical direction (Z direction) at an approximately central portion of the sensing area SA. The IPO barrier 140 may be arranged at a position sufficiently spaced apart in the vertical direction (Z direction) from electrodes constituting the image sensor 100, in particular, from the transfer gate 114 of each of the first to fourth transfer transistors TX1, TX2, TX3, and TX4. Accordingly, even though the size of the pixel unit PXU of the image sensor 100 is reduced, an FWC in the first to fourth photodiodes PD1, PD2, PD3, and PD4 may be easily increased without electrical interference between the electrodes in the image sensor 100 and the IPO barrier 140. Accordingly, the image sensor 100 may provide excellent sensitivity and color quality.

In addition, because the IPO barrier 140 in the sensing area SA of the pixel unit PXU of the image sensor 100 is arranged in an approximately central portion of the sensing area SA, the first to fourth photodiodes PD1, PD2, PD3, and PD4 may be connected to one another with only one IPO barrier 140 in one pixel unit PXU. As a comparative example, in the case of an image sensor including a plurality of comparative IPO barriers respectively arranged between the first to fourth photodiodes PD1, PD2, PD3, and PD4 in one pixel unit PXU, the plurality of comparative IPO barriers may be arranged closer to an edge portion of the sensing area SA than a central portion of the sensing area SA. In this case, the planar size of each of the plurality of comparative IPO barriers may be less than the planar size of the IPO barrier 140 arranged in approximately central portion of the sensing area SA as illustrated in FIGS. 3A and 3D. Therefore, an ion implantation process for forming the plurality of comparative IPO barriers may have greater difficulty and lower accuracy than an ion implantation process for forming the IPO barrier 140 arranged in the approximately central portion of the sensing area SA. On the other hand, in a process of forming the IPO barrier 140 included in the image sensor 100 according to embodiments of the inventive concepts, the IPO barrier 140 having a relatively large plane size in the approximately central portion of the sensing area SA may be formed, and thus, during the ion implantation process for forming the IPO barrier 140, process difficulty may be reduced, and the distribution of the concentration of dopants included in the IPO barrier 140 may be improved. In addition, because the IPO barrier 140 is arranged in the approximately central portion of the sensing area SA, a separation distance between the IPO barrier 140 and the device isolation structure 110 may be relatively increased. Accordingly, even when there is a damaged portion on the surface of the substrate 102 around the device isolation structure 110, the IPO barrier 140 may be prevented from being adversely affected by the damaged portion of the substrate 102.

Figure 4:
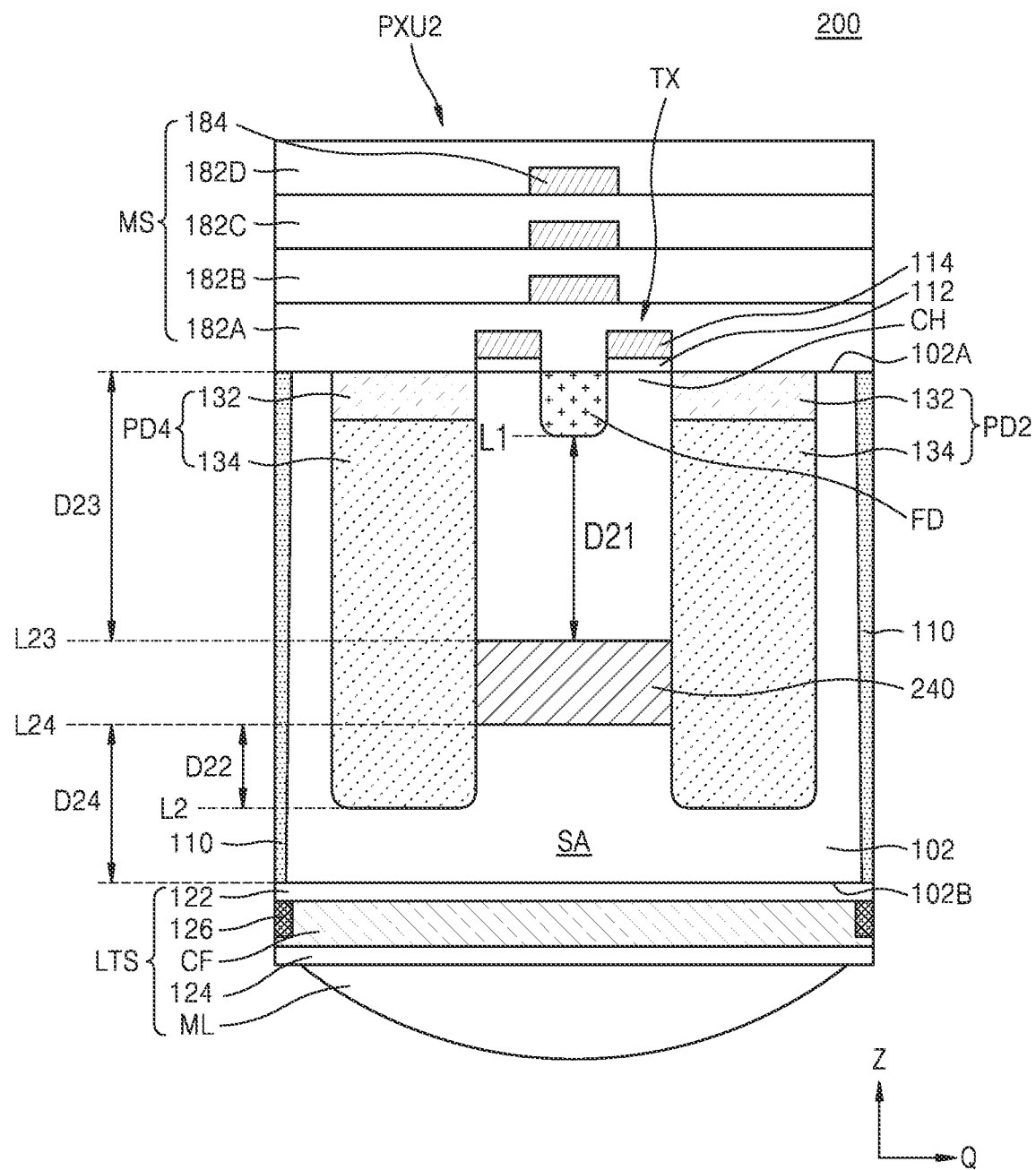
FIG. 4 illustrates a cross-sectional view of an image sensor according to other embodiments of the inventive concepts.

FIG. 4 illustrates a cross-sectional view of an image sensor 200 according to other embodiments of the inventive concepts. FIG. 4 illustrates a cross-sectional configuration of a portion of the image sensor 200 corresponding to the cross-section taken along line I-F of FIG. 3A. In FIG. 4, reference numerals that are the same as those in FIGS. 3A to 3D denote members that are the same as those in FIGS. 3A to 3D, and detailed descriptions thereof are omitted here.

Referring to FIG. 4, the image sensor 200 has substantially the same configuration as the image sensor 100 described with reference to FIGS. 1, 2, and 3A to 3D. However, a pixel unit PXU2 of the image sensor 200 includes an IPO barrier 240.

The IPO barrier 240 has substantially the same configuration as described with respect to the IPO barrier 140 with reference to FIGS. 3A to 3D. However, in the vertical direction (Z direction), a minimum separation distance D21 between a first vertical level L1, which is the bottommost level of the floating diffusion region FD, and a topmost level L23 of the IPO barrier 240 may be greater than a minimum separation distance D22 between a second vertical level L2, which is the bottommost level of each of the first to fourth photodiodes PD1, PD2, PD3, and PD4, and a bottommost level L24 of the IPO barrier 240. In example embodiments, a vertical direction (Z direction) minimum separation distance D23 between the front side surface 102A of the substrate 102 and the IPO barrier 240 may be greater than a vertical direction (Z direction) minimum separation distance D24 between the IPO barrier 240 and the back side surface 102B of the substrate 102.

According to the inventive concepts, the vertical levels of the IPO barriers 140 and 240 described with reference to FIGS. 3A to 3D and 4 are not limited to those illustrated in FIGS. 3A to 3D and 4 and may be variously changed or modified according to electrical characteristics required by the image sensors 100 and 200.

Figure 5:
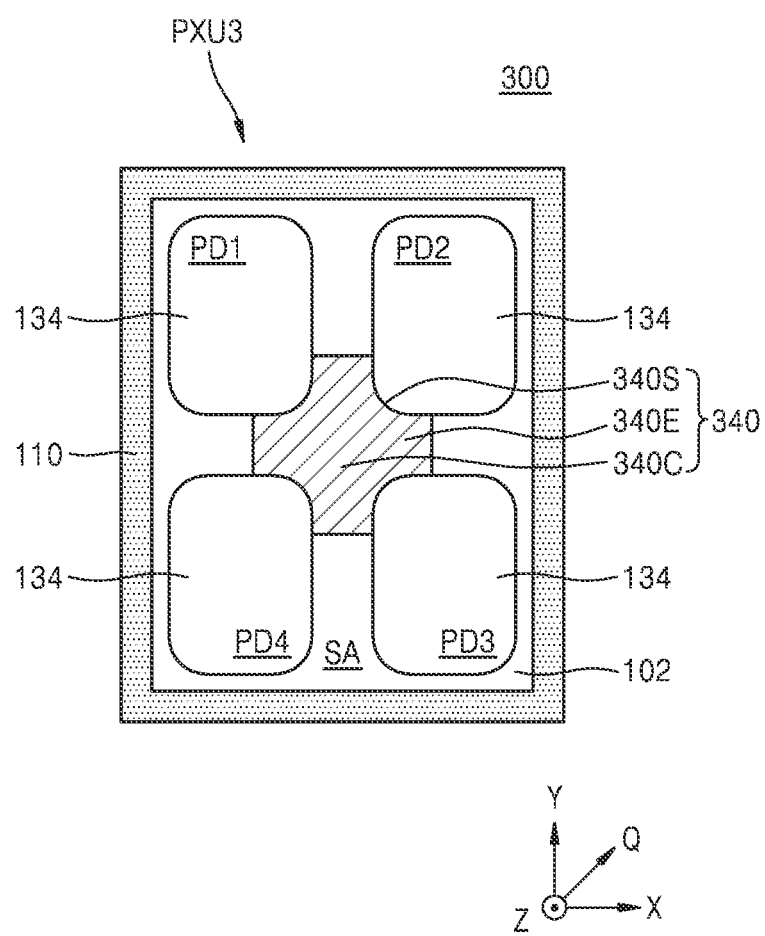
FIG. 5 illustrates a plan layout of an image sensor according to still other embodiments of the inventive concepts.

FIG. 5 illustrates a plan view layout of an image sensor 300 according to still other embodiments of the inventive concepts. In FIG. 5, reference numerals that are the same as those in FIGS. 3A to 3D denote members that are the same as those in FIGS. 3A to 3D, and detailed descriptions thereof are omitted here.

Referring to FIG. 5, the image sensor 300 has substantially the same configuration as the image sensor 100 described with reference to FIGS. 1, 2, and 3A to 3D. However, a pixel unit PXU3 of the image sensor 300 includes an IPO barrier 340. In FIG. 5, similar to that illustrated in FIG. 3D, a plan layout at a level between the topmost level and the bottommost level of the IPO barrier 340 is illustrated.

The IPO barrier 340 may include an IPO barrier center portion 340C arranged in an approximately central portion of the sensing area SA, an IPO barrier extension portion 340E extending from the IPO barrier center portion 340C to a region between two adjacent photodiodes among the first to fourth photodiodes PD1, PD2, PD3, and PD4, and a concave contact surface 340S in contact with the first to fourth photodiodes PD1, PD2, PD3, and PD4.

In example embodiments, in order to manufacture the image sensor 300 having the structure illustrated in FIG. 5, a first impurity ion implantation region for forming the IPO barrier 340 may be formed in the substrate 102, and then an ion implantation process for forming the first to fourth photodiodes PD1, PD2, PD3, and PD4 may be performed on regions overlapping partial regions of the first impurity ion implantation region. As a result, a region, which remains in the substrate 102, in the first impurity ion implantation region after the first to fourth photodiodes PD1, PD2, PD3, and PD4 are formed may constitute the IPO barrier 340.

Figure 6:
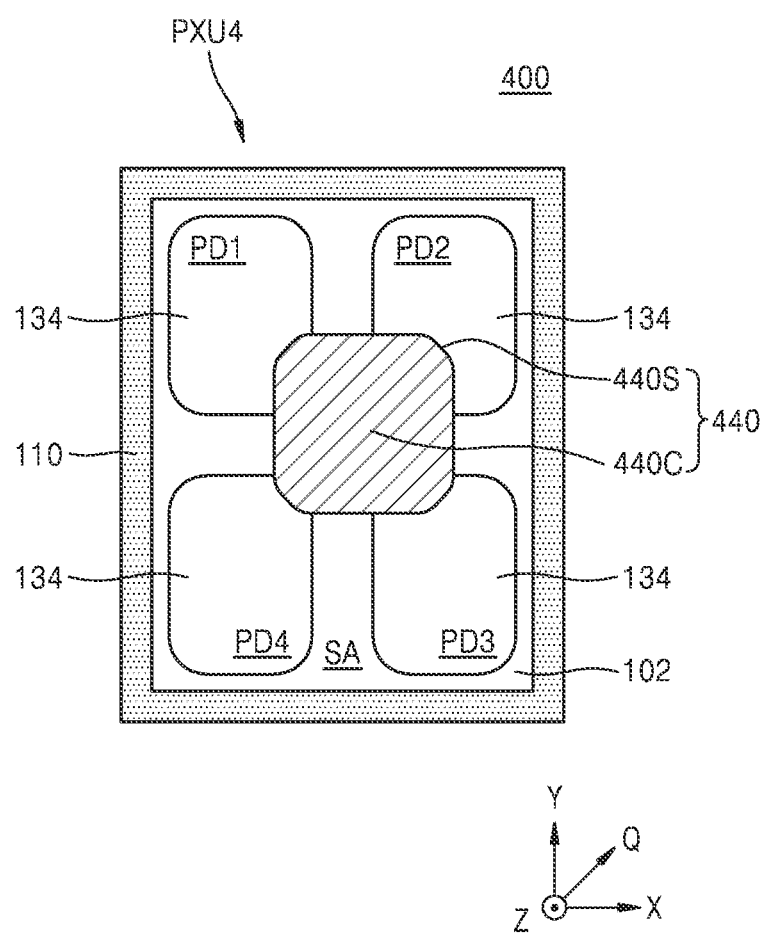
FIG. 6 illustrates a plan layout of an image sensor according to still other embodiments of the inventive concepts.

FIG. 6 illustrates a plan layout of an image sensor 400 according to still other embodiments of the inventive concepts. In FIG. 6, reference numerals that are the same as those in FIGS. 3A to 3D denote members that are the same as those in FIGS. 3A to 3D, and detailed descriptions thereof are omitted here.

Referring to FIG. 6, the image sensor 400 has substantially the same configuration as the image sensor 100 described with reference to FIGS. 1, 2, and 3A to 3D. However, a pixel unit PXU4 of the image sensor 400 includes an IPO barrier 440. In FIG. 6, similar to that illustrated in FIG. 3D, a plan layout at a level between the topmost level and the bottommost level of the IPO barrier 440 is illustrated.

The IPO barrier 440 may include an IPO barrier center portion 440C and a convex contact surface 440S in contact with the first to fourth photodiodes PD1, PD2, PD3, and PD4, similar to the IPO barrier 140 illustrated in FIGS. 3A to 3D. However, in a plan view illustrated in FIG. 6, the center of the IPO barrier 440 does not coincide with the center of the floating diffusion region FD (see FIGS. 3A and 3B). The center of the IPO barrier 440 may be in a position shifted from the center of the floating diffusion region FD (see FIGS. 3A and 3B) toward the device isolation structure 110. In example embodiments, in the plan view illustrated in FIG. 6, the center of the IPO barrier 440 may be in a position shifted from the center of the sensing area SA toward any one photodiode selected from among the first to fourth photodiodes PD1, PD2, PD3, and PD4, or a position shifted toward an arbitrary direction from the center of the sensing area SA. Accordingly, the IPO barrier 440 may have a plurality of contact surfaces in contact with the second semiconductor regions 134 of each of the first to fourth photodiodes PD1, PD2, PD3, and PD4, and at least some of the plurality of contact surfaces may have different areas. For example, as illustrated in FIG. 6, a contact area between the IPO barrier 440 and the first photodiode PD1 may be greater than a contact area between the IPO barrier 440 and the fourth photodiode PD4, may be less than a contact area between the IPO barrier 440 and the second photodiode PD2, and may be the same as or similar to a contact area between the IPO barrier 440 and the third photodiode PD3. However, the inventive concepts are not limited to that illustrated in FIG. 6, and various modifications or changes are possible within the scope of the inventive concept.

Figure 7A:
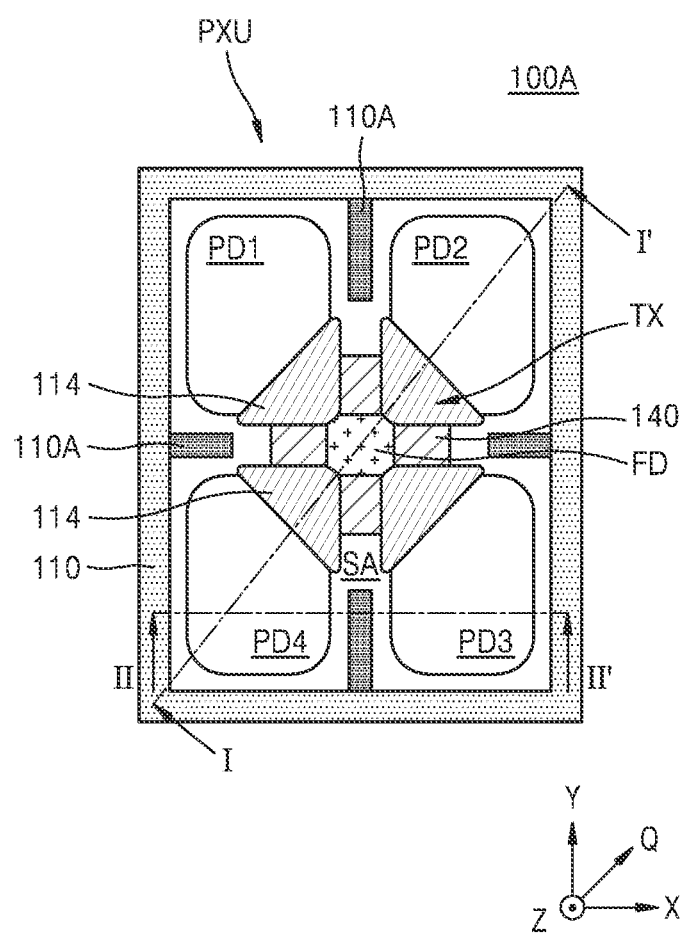
FIG. 7A illustrates a schematic plan view of a partial configuration of an image sensor according to still other embodiments of the inventive concepts.
Figure 7B:
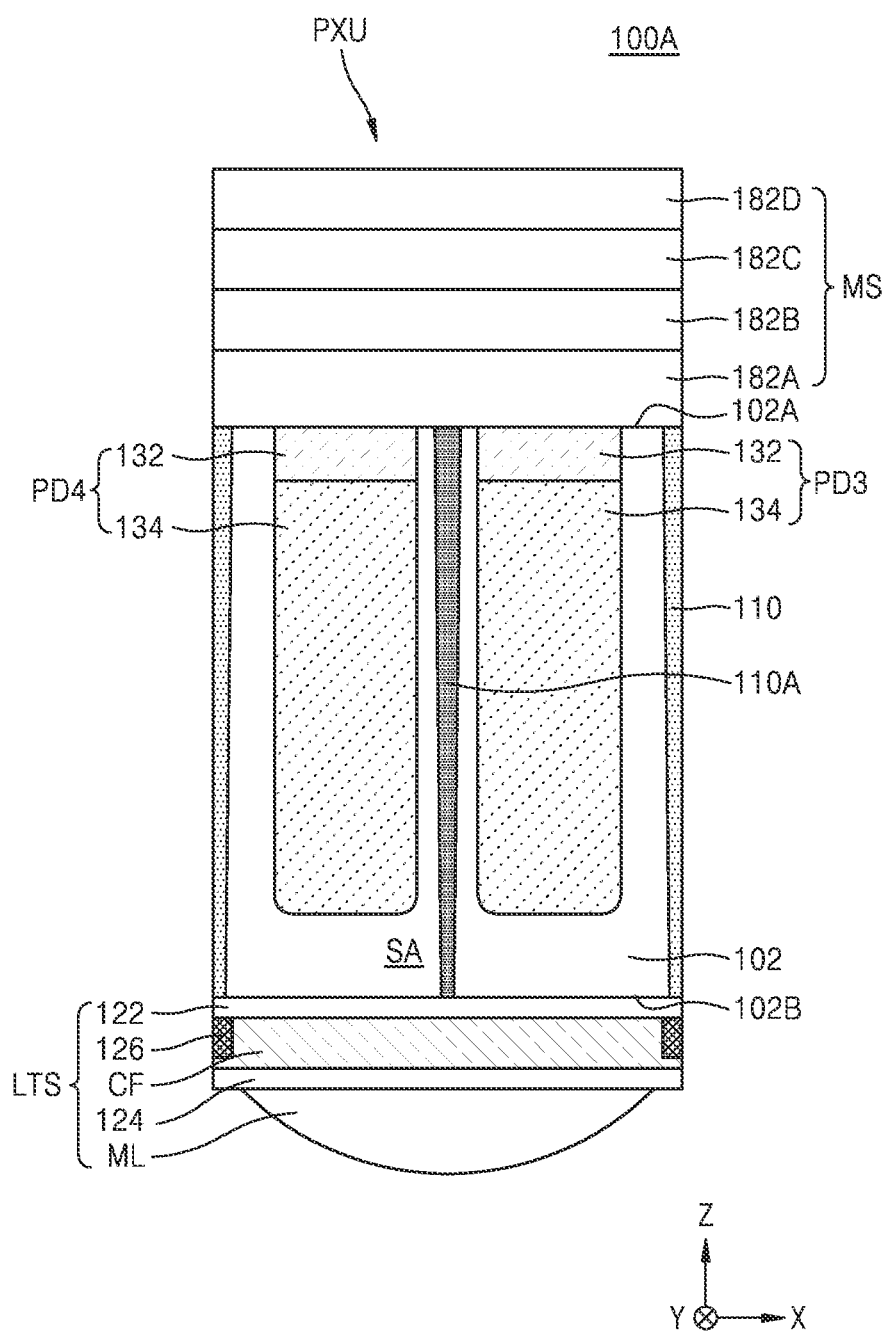
FIG. 7B illustrates a cross-sectional view taken along line II-IT of FIG. 7A.

FIGS. 7A and 7B illustrate views explanatory of an image sensor 100A according to still other embodiments of the inventive concepts. FIG. 7A illustrates a schematic plan view illustrating a partial configuration of the image sensor 100A. FIG. 7B illustrates a cross-sectional view taken along line II-IT of FIG. 7A. In FIGS. 7A and 7B, reference numerals that are the same as those in FIGS. 3A to 3D denote members that are the same as those in FIGS. 3A to 3D, and detailed descriptions thereof are omitted here.

Referring to FIGS. 7A and 7B, the image sensor 100A has substantially the same configuration as the image sensor 100 described with reference to FIGS. 3A to 3D. However, the image sensor 100A further includes a plurality of inner device isolation structures 110A extending from the device isolation structure 110 to the IPO barrier 140 through a partial region of the sensing area SA. The configuration of a cross-section taken along line I-I' of FIG. 7A may be the same as illustrated in FIG. 3B.

Each of the plurality of inner device isolation structures 110A may include a portion connected to the device isolation structure 110. The plurality of inner device isolation structures 110A may be respectively arranged between the first to fourth photodiodes PD1, PD2, PD3, and PD4. The plurality of inner device isolation structures 110A may be spaced apart from the first to fourth photodiodes PD1, PD2, PD3, and PD4, respectively, and the IPO barrier 140. The plurality of inner device isolation structures 110A may prevent electric crosstalk and optical crosstalk between each of the first to fourth photodiodes PD1, PD2, PD3, and PD4, thereby improving auto-focusing characteristics in the pixel unit PXU.

The device isolation structure 110 and the plurality of inner device isolation structures 110A may each extend in the vertical direction (Z direction) from the front side surface 102A of the substrate 102 to the back side surface 102B of the substrate 102. The device isolation structure 110 and the plurality of inner device isolation structures 110A may have substantially the same length in the vertical direction (Z direction). Each of the device isolation structure 110 and the plurality of inner device isolation structures 110A may have a horizontal width (e.g., a width in an X direction in FIG. 7B) that gradually increases away from the microlens ML. In example embodiments, the device isolation structure 110 and the plurality of inner device isolation structures 110A may be simultaneously formed. For example, the device isolation structure 110 and the plurality of inner device isolation structures 110A may be simultaneously formed in a process described below with reference to FIG. 15B. A more detailed configuration of each of the plurality of inner device isolation structures 110A is substantially the same as described with respect to the device isolation structure 110 with reference to FIGS. 3A to 3D.

Figure 8A:
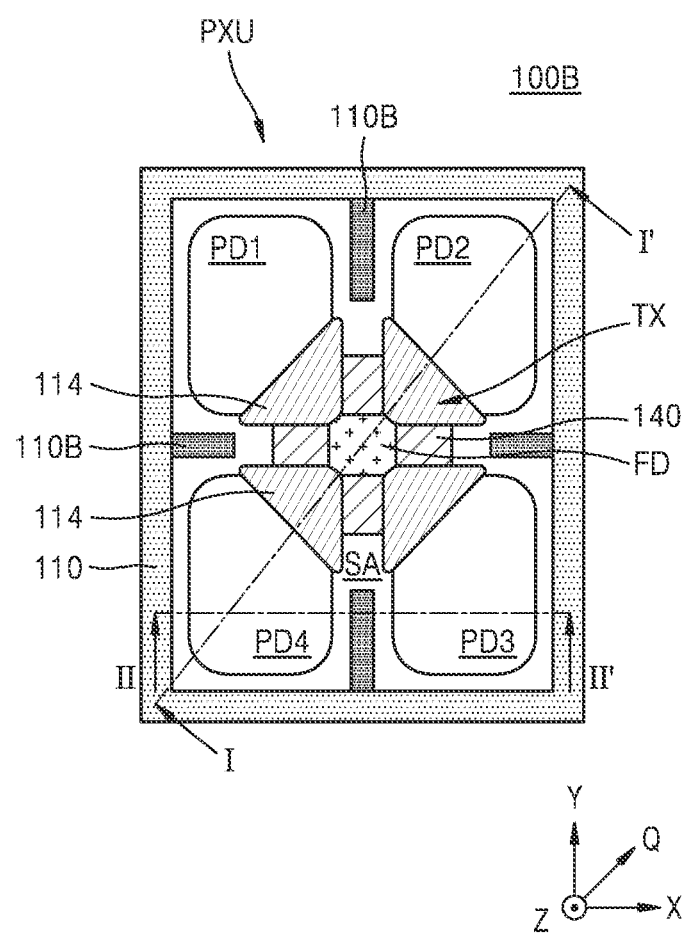
FIG. 8A illustrates a schematic plan view of a partial configuration of an image sensor according to still other embodiments of the inventive concepts.
Figure 8B:
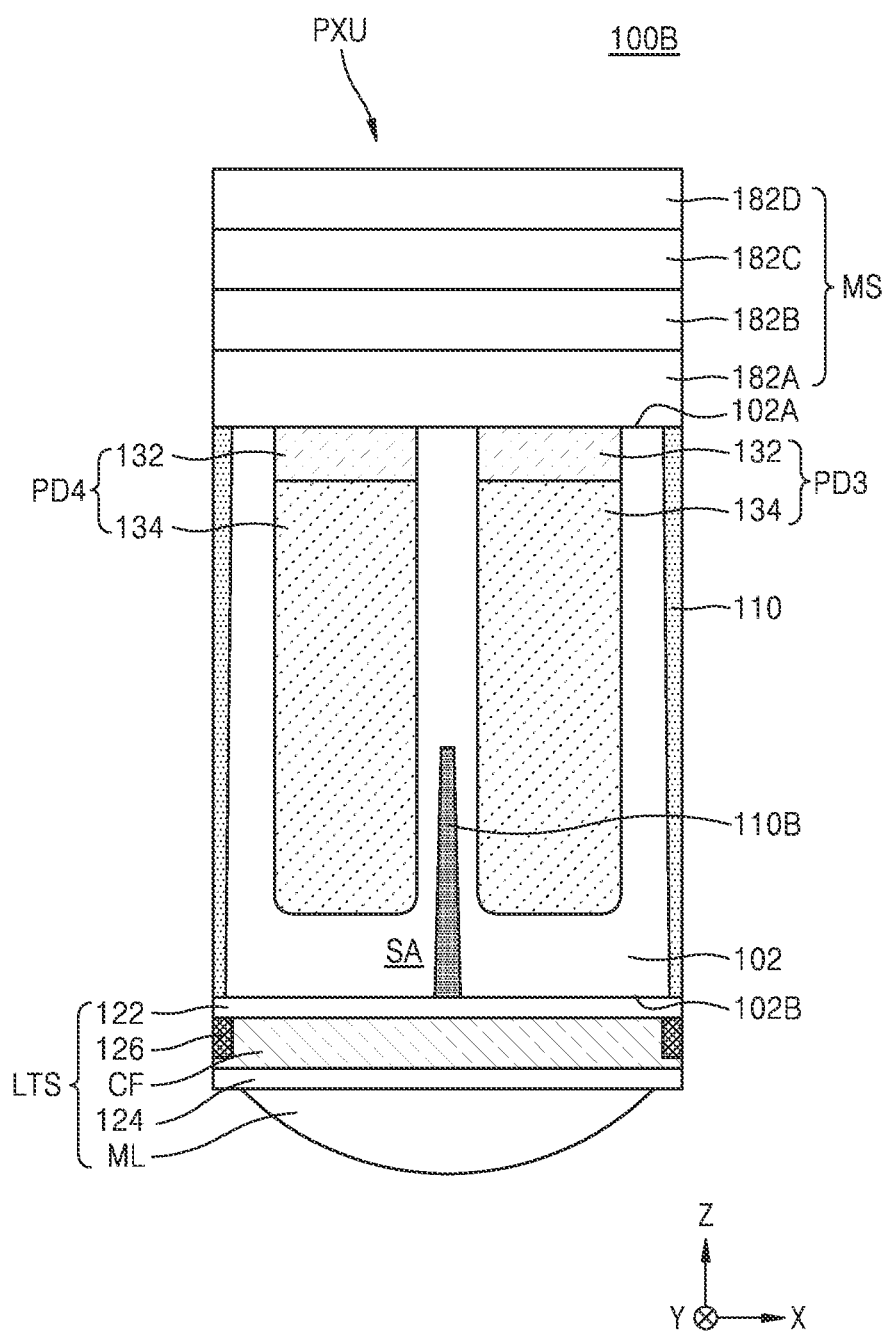
FIG. 8B illustrates a cross-sectional view taken along line II-II' of FIG. 8A.

FIGS. 8A and 8B illustrate views explanatory of an image sensor 100B according to still other embodiments of the inventive concepts. FIG. 8A illustrates a schematic plan view of a partial configuration of the image sensor 100B. FIG. 8B illustrates a cross-sectional view taken along line II-IF of FIG. 8A. In FIGS. 8A and 8B, reference numerals that are the same as those in FIGS. 3A to 3D denote members that are the same as those in FIGS. 3A to 3D, and detailed descriptions thereof are omitted here.

Referring to FIGS. 8A and 8B, the image sensor 100B has substantially the same configuration as the image sensor 100 described with reference to FIGS. 3A to 3D. However, the image sensor 100B further includes a plurality of inner device isolation structures 110B extending from the device isolation structure 110 to the IPO barrier 140 through a partial region of the sensing area SA. The configuration of a cross-section taken along line I-I' of FIG. 8A may be the same as illustrated in FIG. 3B.

Each of the plurality of inner device isolation structures 110B may include a portion in contact with the device isolation structure 110. The plurality of inner device isolation structures 110B may be respectively arranged between the first to fourth photodiodes PD1, PD2, PD3, and PD4.

The plurality of inner device isolation structures 110B may provide effects similar to those described for the plurality of inner device isolation structures 110A described with reference to FIGS. 7A and 7B. However, the length of each of the plurality of inner device isolation structures 110B in the vertical direction (Z direction) may be less than the length of the device isolation structure 110. Each of the plurality of inner device isolation structures 110B may extend from the back side surface 102B of the substrate 102 to the inside of the substrate 102 by a partial thickness of the substrate 102.

Each of the plurality of inner device isolation structures 110B may have a horizontal width (e.g., a width in the X direction in FIG. 8B) that gradually decreases away from the microlens ML. The plurality of inner device isolation structures 110B may be formed after the device isolation structures 110 are formed. For example, the device isolation structure 110 may be formed in a process described below with reference to FIG. 15B, and the plurality of inner device isolation structures 110B may be formed before a process described below with reference to FIG. 15F after a process described below with reference to FIG. 15E. A more detailed configuration of each of the plurality of inner device isolation structures 110B is substantially the same as described with respect to the device isolation structure 110 with reference to FIGS. 3A to 3D.

Figure 9A:
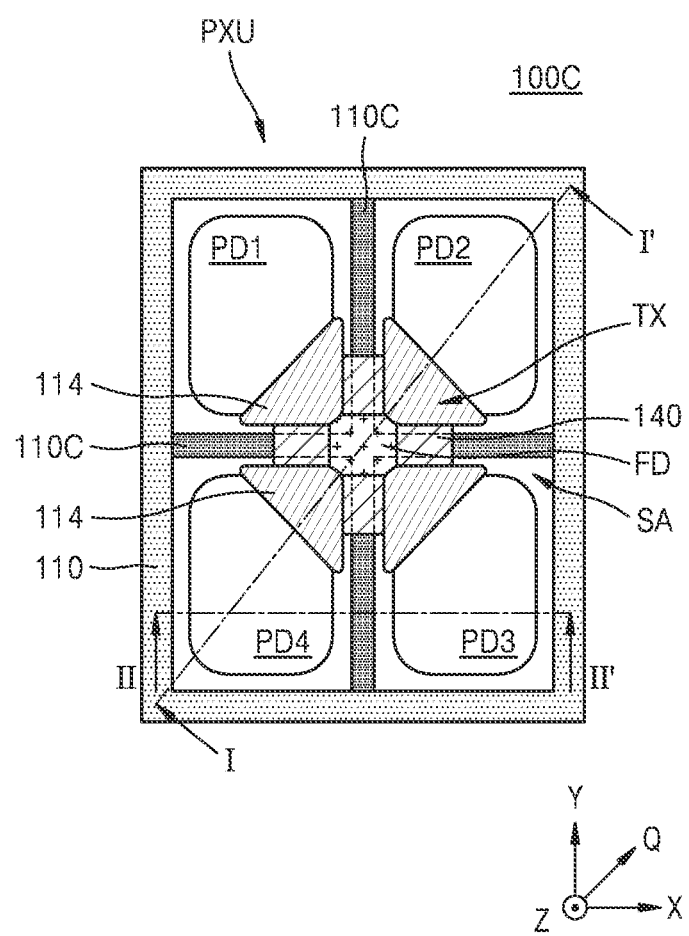
FIG. 9A illustrates a schematic plan view of a partial configuration of an image sensor according to still other embodiments of the inventive concepts.
Figure 9B:
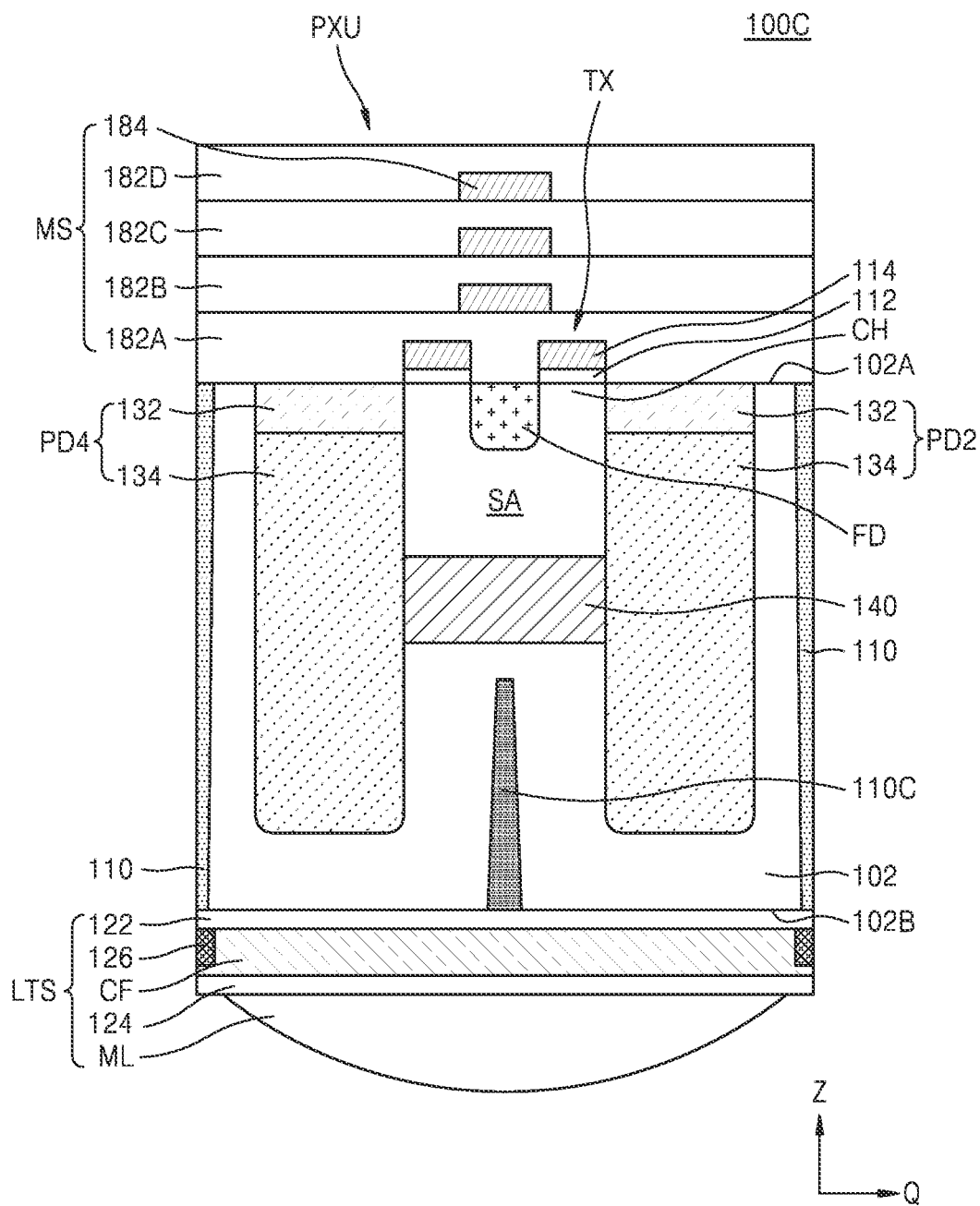
FIG. 9B illustrates a cross-sectional view taken along line I-I' of FIG. 9A.
Figure 9C:
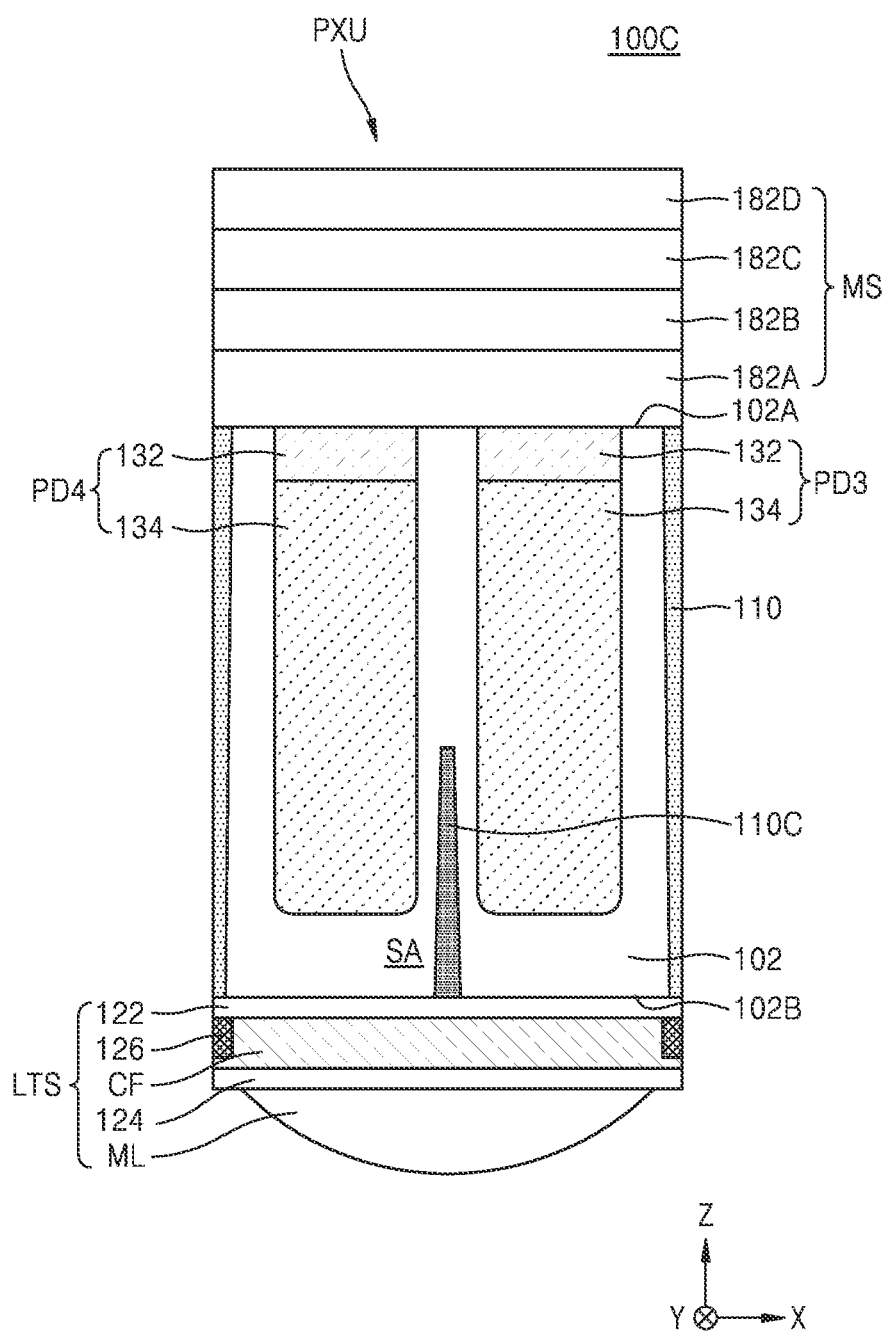
FIG. 9C illustrates a cross-sectional view taken along line II-IT of FIG. 9A.

FIGS. 9A to 9C illustrate views explanatory of an image sensor 100C according to still other embodiments of the inventive concepts. FIG. 9A illustrates a schematic plan view of a partial configuration of the image sensor 100C. FIG. 9B illustrates a cross-sectional view taken along line I-I' of FIG. 9A. FIG. 9C illustrates a cross-sectional view taken along line II-II' of FIG. 9A. In FIGS. 9A to 9C, reference numerals that are the same as those in FIGS. 3A to 3D denote members that are the same as those in FIGS. 3A to 3D, and detailed descriptions thereof are omitted here.

Referring to FIGS. 9A to 9C, the image sensor 100C has substantially the same configuration as the image sensor 100 described with reference to FIGS. 3A to 3D. However, the image sensor 100C further includes an inner device isolation structure 110C passing through a partial region of the sensing area SA from the device isolation structure 110.

As illustrated in FIG. 9A, the inner device isolation structure 110C may have a cross shape in a plan view. The inner device isolation structure 110C may be spaced apart from the first to fourth photodiodes PD1, PD2, PD3, and PD4 and the IPO barrier 140. The inner device isolation structure 110C may include a portion vertically overlapping the IPO barrier 140 and the floating diffusion region FD at an approximately central portion of the sensing area SA.

The inner device isolation structure 110C may include portions in contact with the device isolation structure 110. The inner device isolation structure 110C may have branches extending between each of the first to fourth photodiodes PD1, PD2, PD3, and PD4. The branches of the inner device isolation structure 110C may be contiguous with each other. The inner device isolation structure 110C may have substantially the same configuration as the plurality of inner device isolation structures 110A described with reference to FIGS. 7A and 7B and provide effects similar to those described for the plurality of inner device isolation structures 110A. However, the length of the inner device isolation structure 110C in the vertical direction (Z direction) may be less than the length of the device isolation structure 110. The inner device isolation structure 110C may extend from the back side surface 102B of the substrate 102 to the inside of the substrate 102 by a partial thickness of the substrate 102. The inner device isolation structure 110C may have a horizontal width (e.g., a width in the X direction in FIG. 9C) that gradually decreases away from the microlens ML. The inner device isolation structure 110C may be formed after the device isolation structure 110 is formed, similar to that described with respect to the plurality of inner device isolation structures 110B with reference to FIGS. 8A and 8B. A more detailed configuration of the inner device isolation structure 110C is substantially the same as described with respect to the device isolation structure 110 with reference to FIGS. 3A to 3D.

Figure 10A:
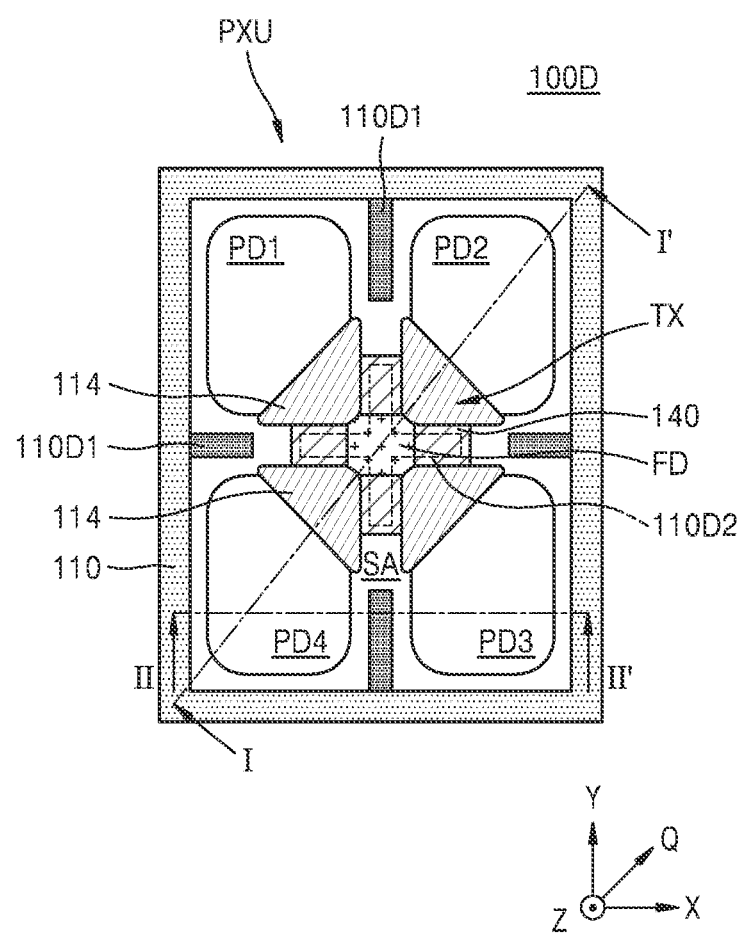
FIG. 10A illustrates a schematic plan view of a partial configuration of an image sensor according to still other embodiments of the inventive concepts.
Figure 10B:
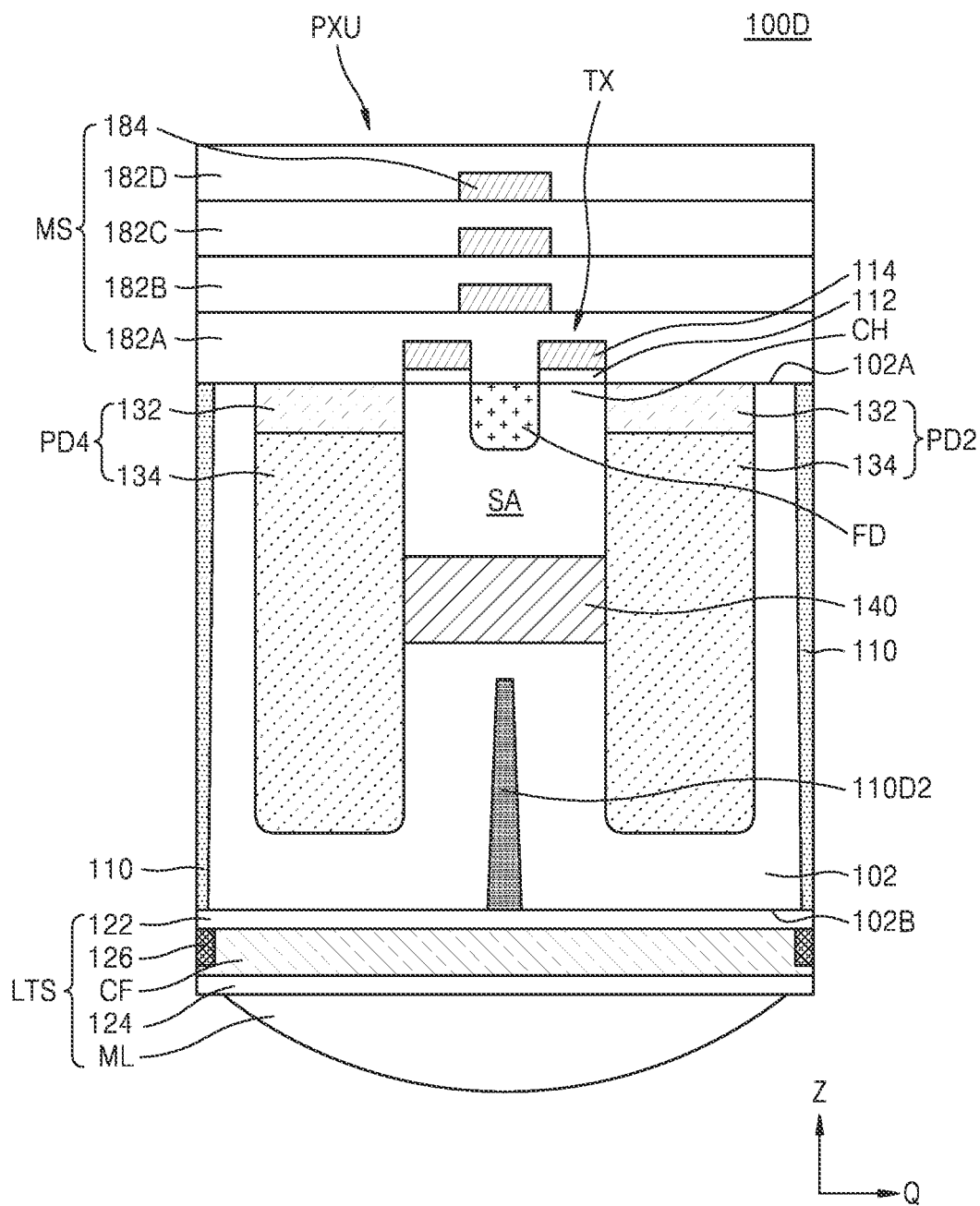
FIG. 10B illustrates a cross-sectional view taken along line I-I' of FIG. 10A.
Figure 10C:
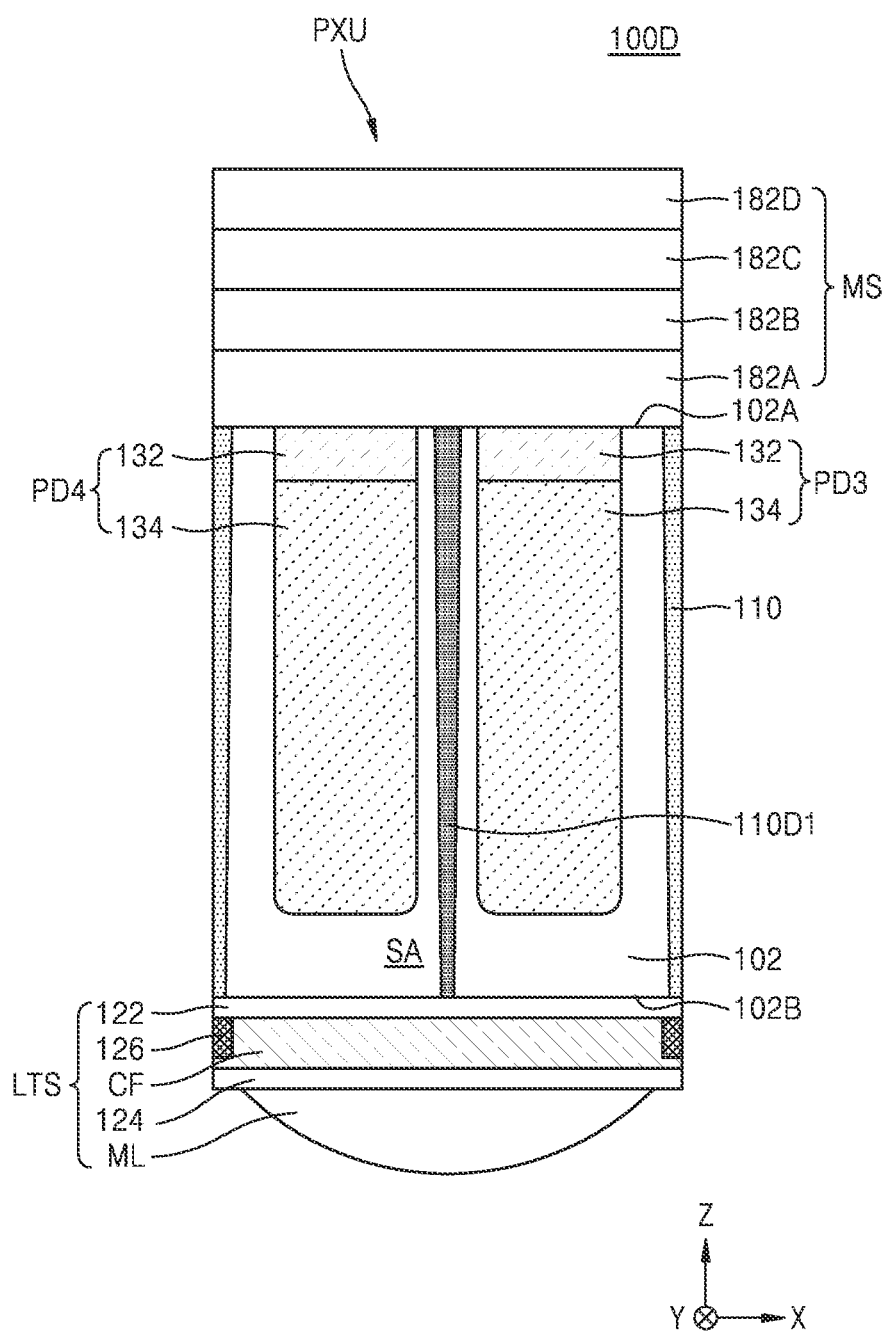
FIG. 10C illustrates a cross-sectional view taken along line II-II' of FIG. 10A.

FIGS. 10A to 10C illustrate views explanatory of an image sensor 100D according to still other embodiments of the inventive concepts. FIG. 10A illustrates a schematic plan view of a partial configuration of the image sensor 100D. FIG. 10B illustrates a cross-sectional view taken along line I-I' of FIG. 10A. FIG. 10C illustrates a cross-sectional view taken along line II-II' of FIG. 10A. In FIGS. 10A to 10C, reference numerals that are the same as those in FIGS. 3A to 3D denote members that are the same as those in FIGS. 3A to 3D, and detailed descriptions thereof are omitted here.

Referring to FIGS. 10A to 10C, the image sensor 100D has substantially the same configuration as the image sensor 100 described with reference to FIGS. 3A to 3D. However, the image sensor 100C includes a plurality of first inner device isolation structures 110D1 arranged adjacent to the device isolation structure 110 of the sensing area SA, and a second inner device isolation structure 110D2 arranged in an approximately central portion of the sensing area SA.

The plurality of first inner device isolation structures 110D1 may have substantially the same configuration as described with respect to the plurality of inner device isolation structures 110A with reference to FIGS. 7A and 7B. The second inner device isolation structure 110D2 may be spaced apart from the plurality of first inner device isolation structures 110D1 in a horizontal direction (e.g., X and Y directions in FIG. 10A), and may have a cross shape in a plan view. The second inner device isolation structure 110D2 may include a portion vertically overlapping the IPO barrier 140 and the floating diffusion region FD at an approximately central portion of the sensing area SA. Each of the plurality of first inner device isolation structures 110D1 may include a portion in contact with the device isolation structure 110. The second inner device isolation structure 110D2 may be horizontally spaced apart from the device isolation structure 110 and vertically spaced apart from the IPO barrier 140.

The length of the second inner device isolation structure 110D2 in the vertical direction (Z direction) may be less than the length of each of the plurality of first inner device isolation structures 110D1 in the vertical direction (Z direction). Each of the plurality of first inner device isolation structures 110D1 may have a horizontal width (e.g., a width in an X direction in FIG. 10C) that gradually increases away from the microlens ML. The second inner device isolation structure 110D2 may have a horizontal width (e.g., a width in a Q direction in FIG. 10B) that gradually decreases away from the microlens ML.

A more detailed configuration of the second inner device isolation structure 110D2 is substantially the same as described for the inner device isolation structure 110C with reference to FIGS. 9A to 9C.

Figure 11A:
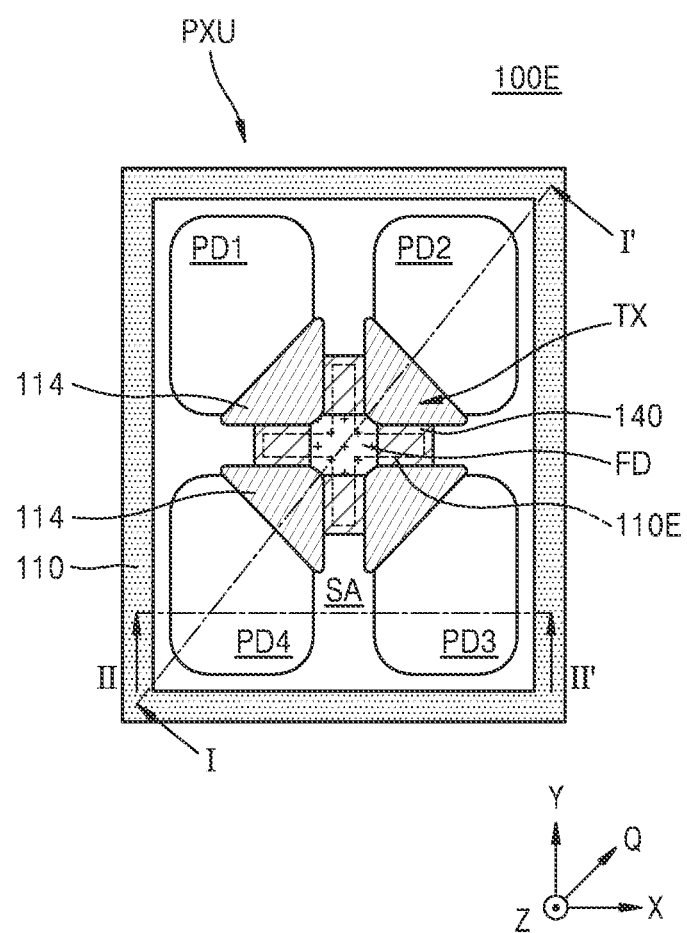
FIG. 11A illustrates a schematic plan view of a partial configuration of an image sensor according to still other embodiments of the inventive concepts.
Figure 11B:
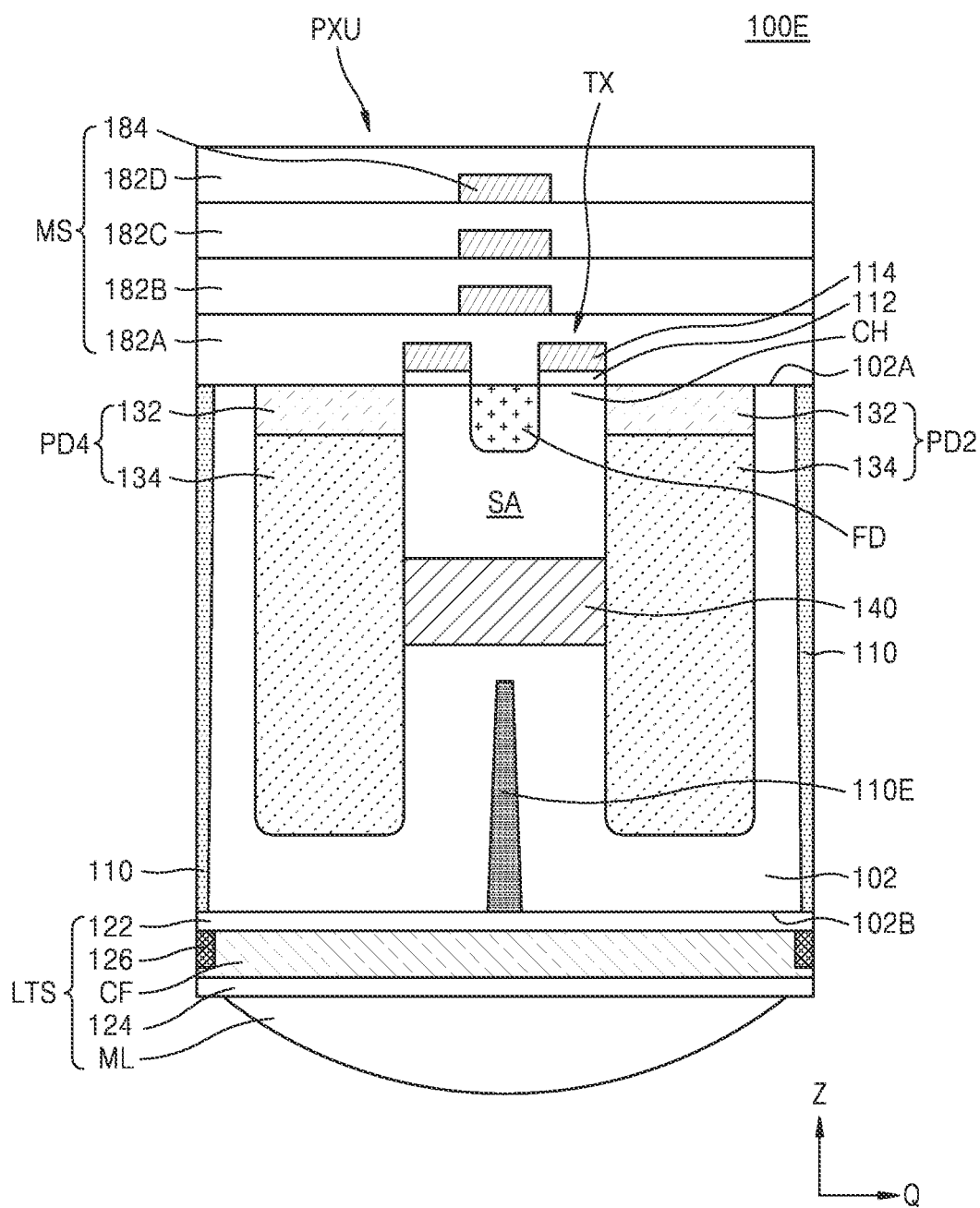
FIG. 11B illustrates a cross-sectional view taken along line I-I' of FIG. 11A.

FIGS. 11A and 11B illustrate views explanatory of an image sensor 100E according to still other embodiments of the inventive concepts. FIG. 11A illustrates a schematic plan view of a partial configuration of the image sensor 100E. FIG. 11B illustrates a cross-sectional view taken along line I-I' of FIG. 11A. In FIGS. 11A and 11B, reference numerals that are the same as those in FIGS. 3A to 3D denote members that are the same as those in FIGS. 3A to 3D, and detailed descriptions thereof are omitted here.

Referring to FIGS. 11A and 11B, the image sensor 100E has substantially the same configuration as the image sensor 100 described with reference to FIGS. 3A to 3D. However, the image sensor 100B further includes an inner device isolation structure 110E extending from the back side surface 102B of the substrate 102 toward the IPO barrier 140 through a partial region of the sensing area SA. The configuration of a cross-section taken along line II-IF of FIG. 11A may be the same as illustrated in FIG. 3C.

The inner device isolation structure 110E may have substantially the same configuration as described with respect to the second inner device isolation structure 110D2 with reference to FIGS. 10A to 10C, and may provide effects similar to those described for the plurality of inner device isolation structures 110A with reference to FIGS. 7A and 7B.

Figure 12A:
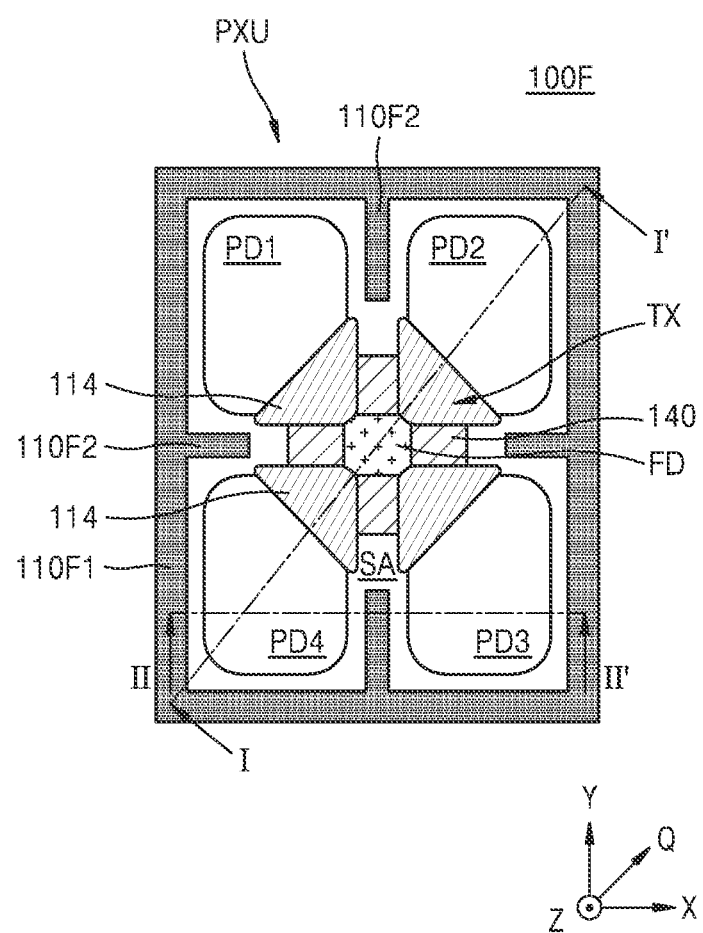
FIG. 12A illustrates a schematic plan view of a partial configuration of an image sensor according to still other embodiments of the inventive concepts.
Figure 12B:
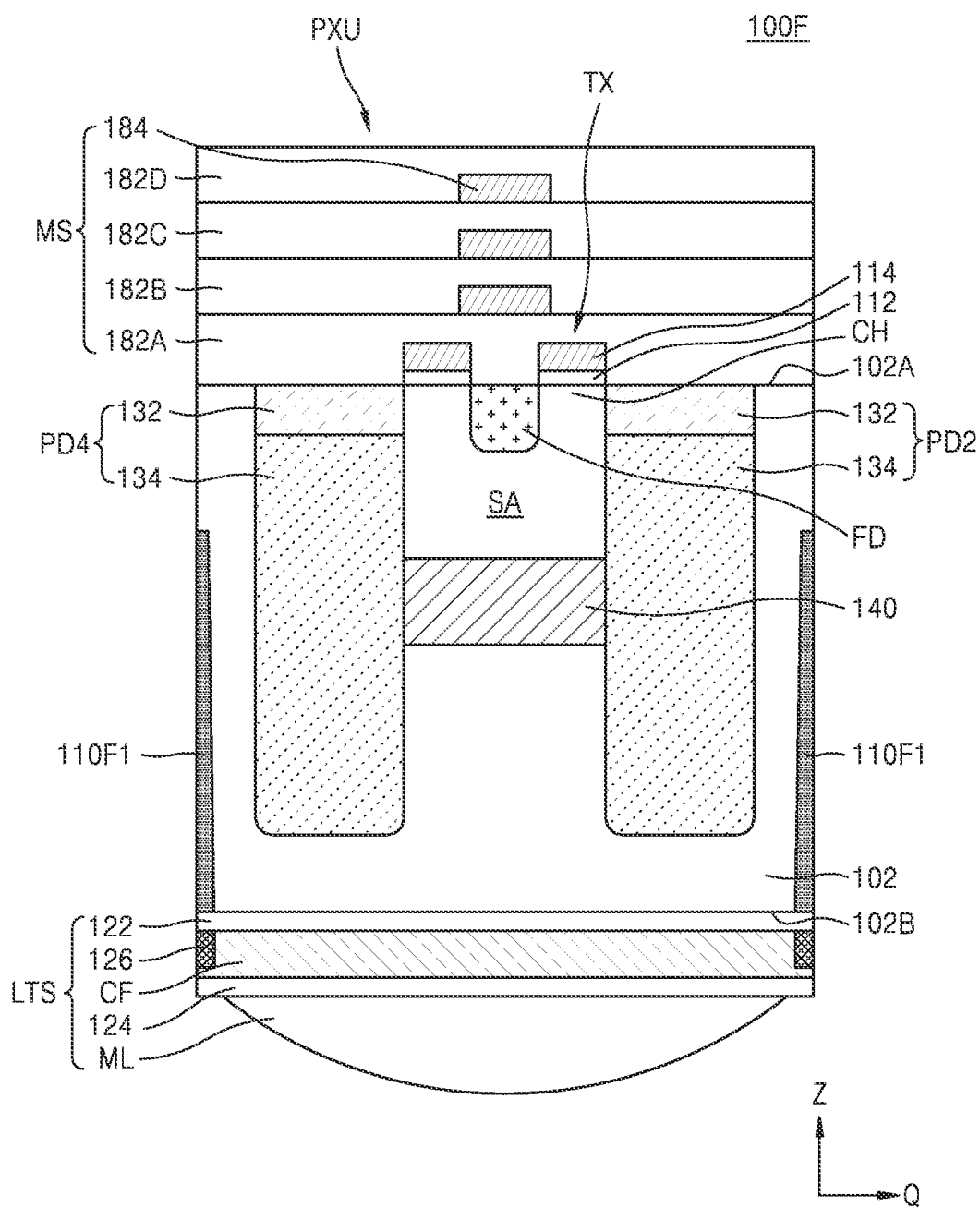
FIG. 12B illustrates a cross-sectional view taken along line I-I' of FIG. 12A.
Figure 12C:
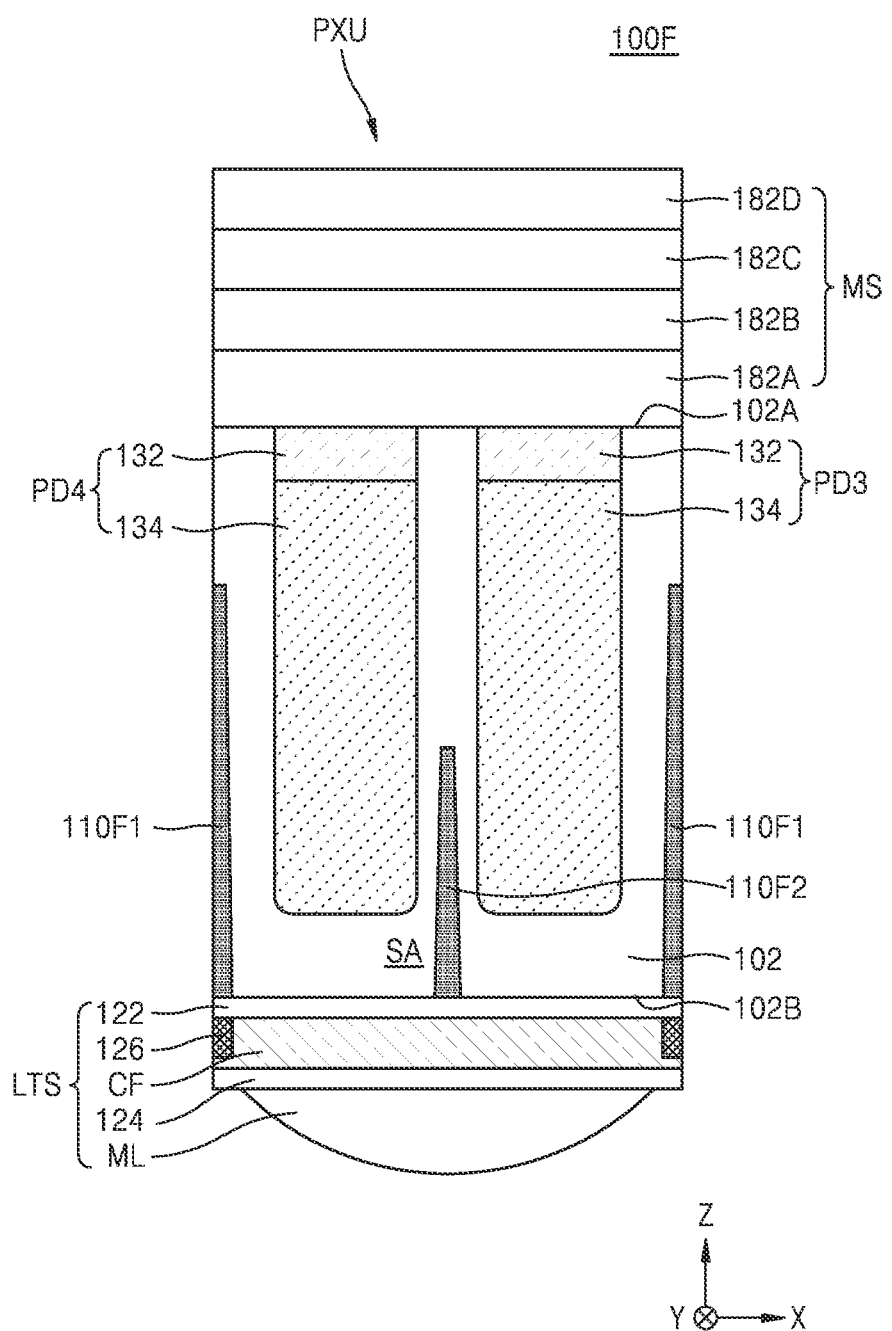
FIG. 12C illustrates a cross-sectional view taken along line II-II' of FIG. 12A.

FIGS. 12A to 12C illustrate views explanatory of an image sensor 100F according to still other embodiments of the inventive concepts. FIG. 12A illustrates a schematic plan view of a partial configuration of the image sensor 100F. FIG. 12B illustrates a cross-sectional view taken along line I-I' of FIG. 12A. FIG. 12C illustrates a cross-sectional view taken along line II-II' of FIG. 12A. In FIGS. 12A to 12C, reference numerals the same as those in FIGS. 3A to 3D denote members that are respectively the same as those in FIGS. 3A to 3D, and detailed descriptions thereof are omitted here.

Referring to FIGS. 12A to 12C, the image sensor 100F has substantially the same configuration as the image sensor 100 described with reference to FIGS. 3A to 3D. However, the image sensor 100F includes a device isolation structure 110F1 defining the sensing area SA, and a plurality of inner device isolation structures 110F2 integrally connected to the device isolation structure 110F1 and extending from the device isolation structure 110F1 toward the IPO barrier 140 through a partial region of the sensing area SA.

The plurality of inner device isolation structures 110F2 may be respectively arranged between the first to fourth photodiodes PD1, PD2, PD3, and PD4. The plurality of inner device isolation structures 110F2 may be spaced apart from the first to fourth photodiodes PD1, PD2, PD3, and PD4, respectively, and the IPO barrier 140.

The device isolation structure 110F1 and the plurality of inner device isolation structures 110F2 may each extend in the vertical direction (Z direction) from the back side surface 102B of the substrate 102 toward the front side surface 102A of the substrate 102. The device isolation structure 110F1 and the plurality of inner device isolation structures 110F2 may each be spaced apart from the front side surface 102A of the substrate 102 in the vertical direction (Z direction). The plurality of inner device isolation structures 110F2 may provide effects similar to those of the plurality of inner device isolation structures 110A described with reference to FIGS. 7A and 7B.

In the vertical direction (Z direction), the length of each of the plurality of inner device isolation structures 110F2 may be less than the length of the device isolation structure 110F1. Each of the device isolation structure 110F1 and the plurality of inner device isolation structures 110F2 may have a horizontal width (e.g., a width in the X direction in FIG. 12C) that gradually decreases away from the microlens ML. The first device isolation structure 110F1 and the plurality of inner device isolation structures 110F2 may be simultaneously formed. For example, the first device isolation structure 110F1 and the plurality of inner device isolation structures 110F2 may be simultaneously formed before a process described below with reference to FIG. 15F after a process described below with reference to FIG. 15E.

A detailed configuration of a material of the first device isolation structure 110F1 and the plurality of inner device isolation structures 110F2 is substantially the same as described with respect to the device isolation structure 110 with reference to FIGS. 3A to 3D.

Figure 13A:
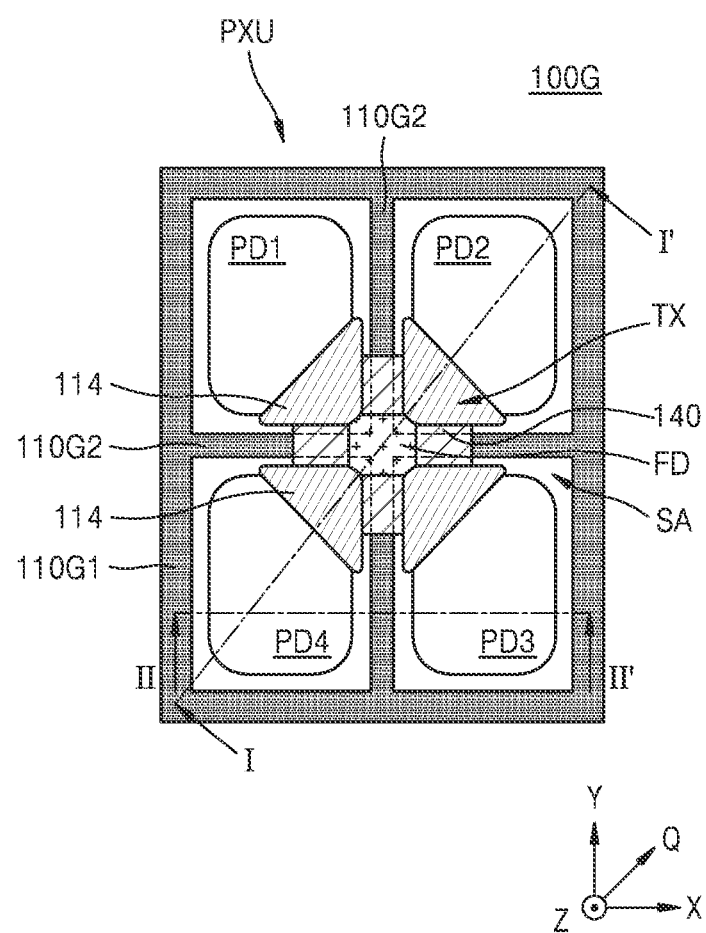
FIG. 13A illustrates a schematic plan view of a partial configuration of an image sensor according to still other embodiments of the inventive concepts.
Figure 13B:
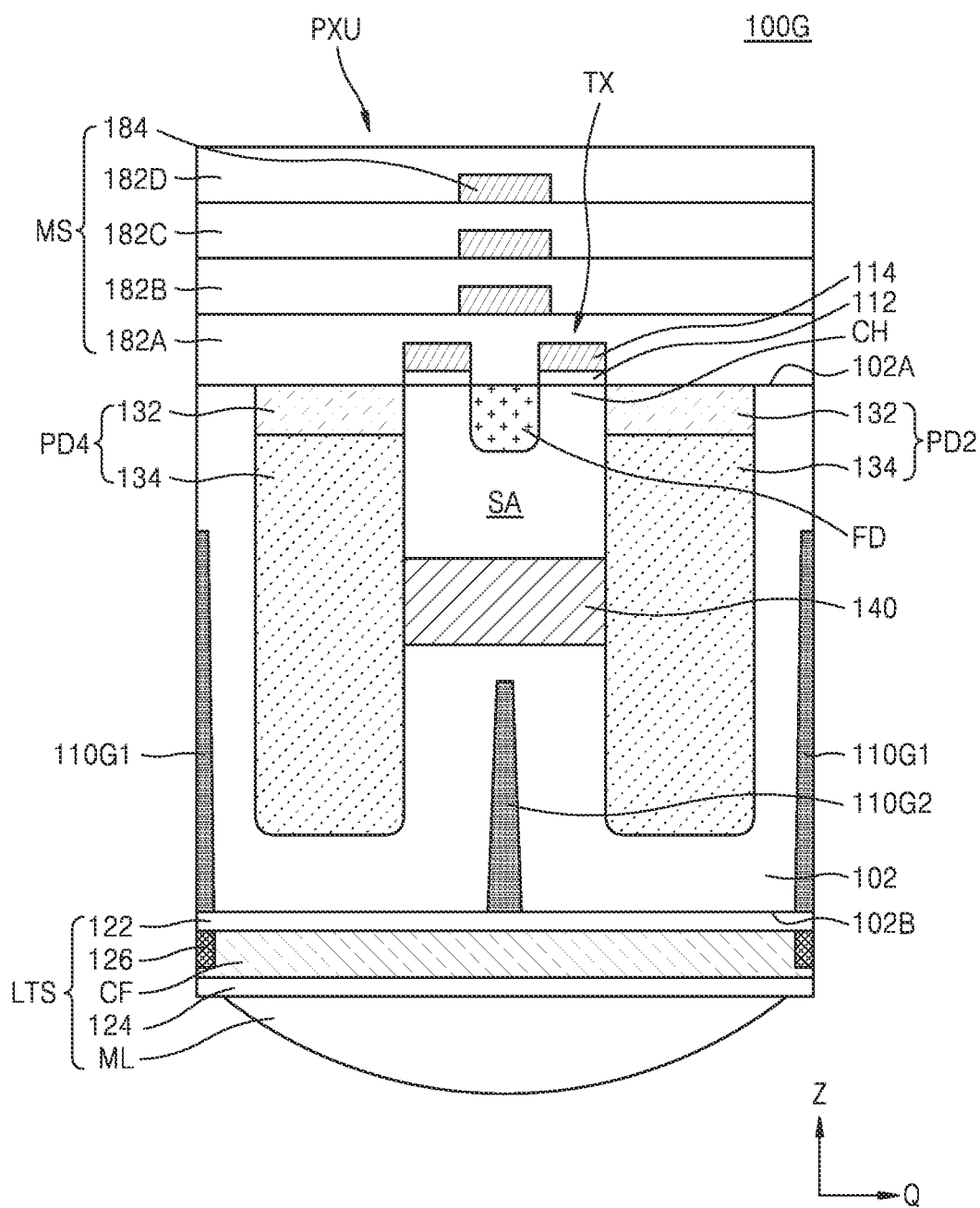
FIG. 13B illustrates a cross-sectional view taken along line I-I' of FIG. 13A.
Figure 13C:
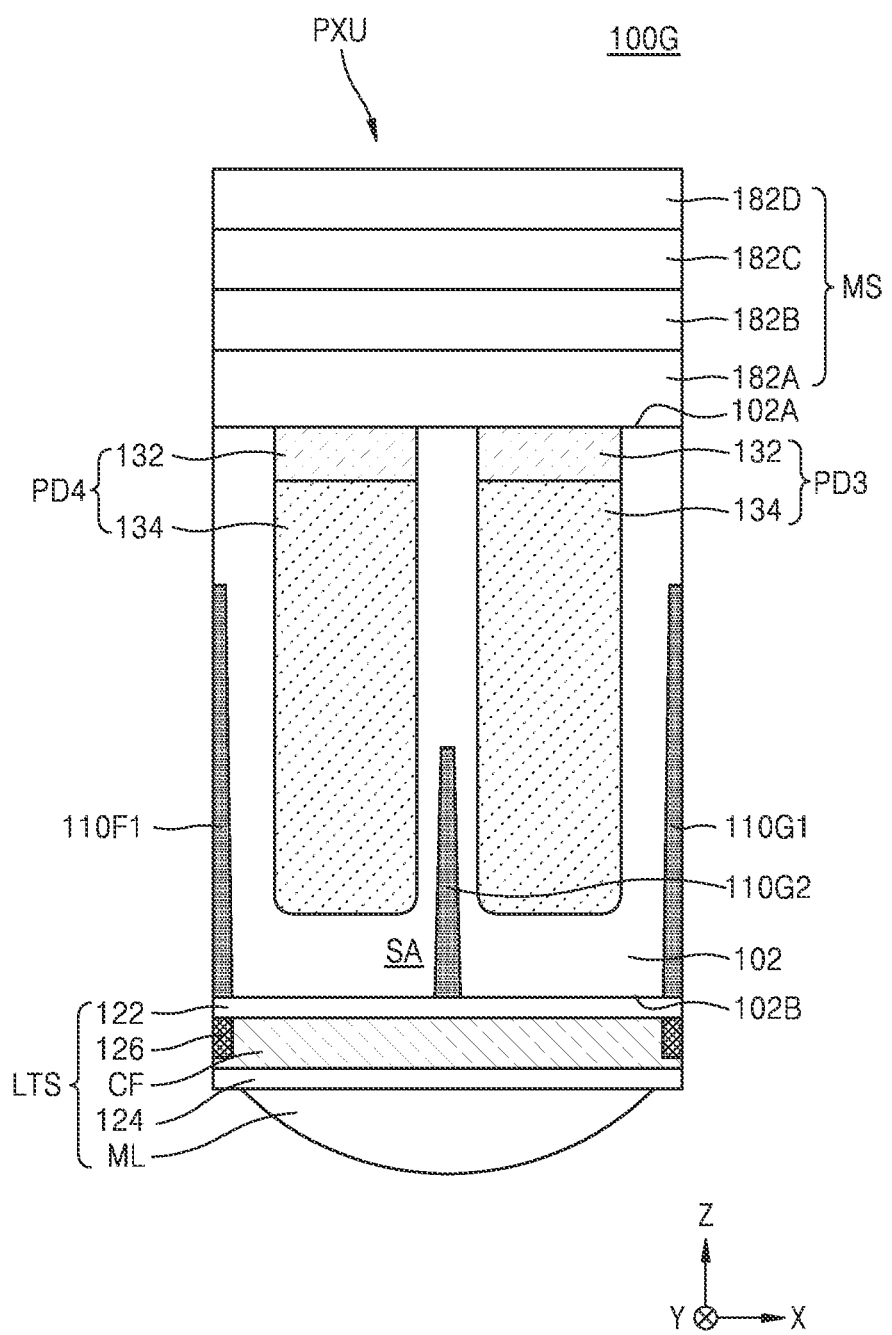
FIG. 13C illustrates a cross-sectional view taken along line II-IT of FIG. 13A.

FIGS. 13A to 13C illustrate views explanatory of an image sensor 100G according to still other embodiments of the inventive concepts. FIG. 13A illustrates a schematic plan view of a partial configuration of the image sensor 100G. FIG. 13B illustrates a cross-sectional view taken along line I-I' of FIG. 13A. FIG. 13C illustrates a cross-sectional view taken along line II-II' of FIG. 13A. In FIGS. 13A to 13C, reference numerals that are the same as those in FIGS. 3A to 3D denote members that are the same as those in FIGS. 3A to 3D, and detailed descriptions thereof are omitted here.

Referring to FIGS. 13A to 13C, the image sensor 100G has substantially the same configuration as the image sensor 100F described with reference to FIGS. 12A to 12C. However, the image sensor 100G includes a device isolation structure 110G1 defining the sensing area SA and an inner device isolation structure 110G2 integrally connected to the device isolation structure 110G1.

The device isolation structure 110G1 may have substantially the same configuration as described for the device isolation structure 110F1 with reference to FIGS. 12A to 12C. The inner device isolation structure 110G2 may have substantially the same configuration as described for the inner device isolation structure 110C with reference to FIGS. 9A to 9C. The inner device isolation structure 110G2 may provide effects similar to those of the plurality of inner device isolation structures 110A described with reference to FIGS. 7A and 7B. A detailed configuration of a material constituting the device isolation structure 110G1 and the inner device isolation structure 110G2 is substantially the same as described for the device isolation structure 110 with reference to FIGS. 3A to 3D.

Figure 14A:
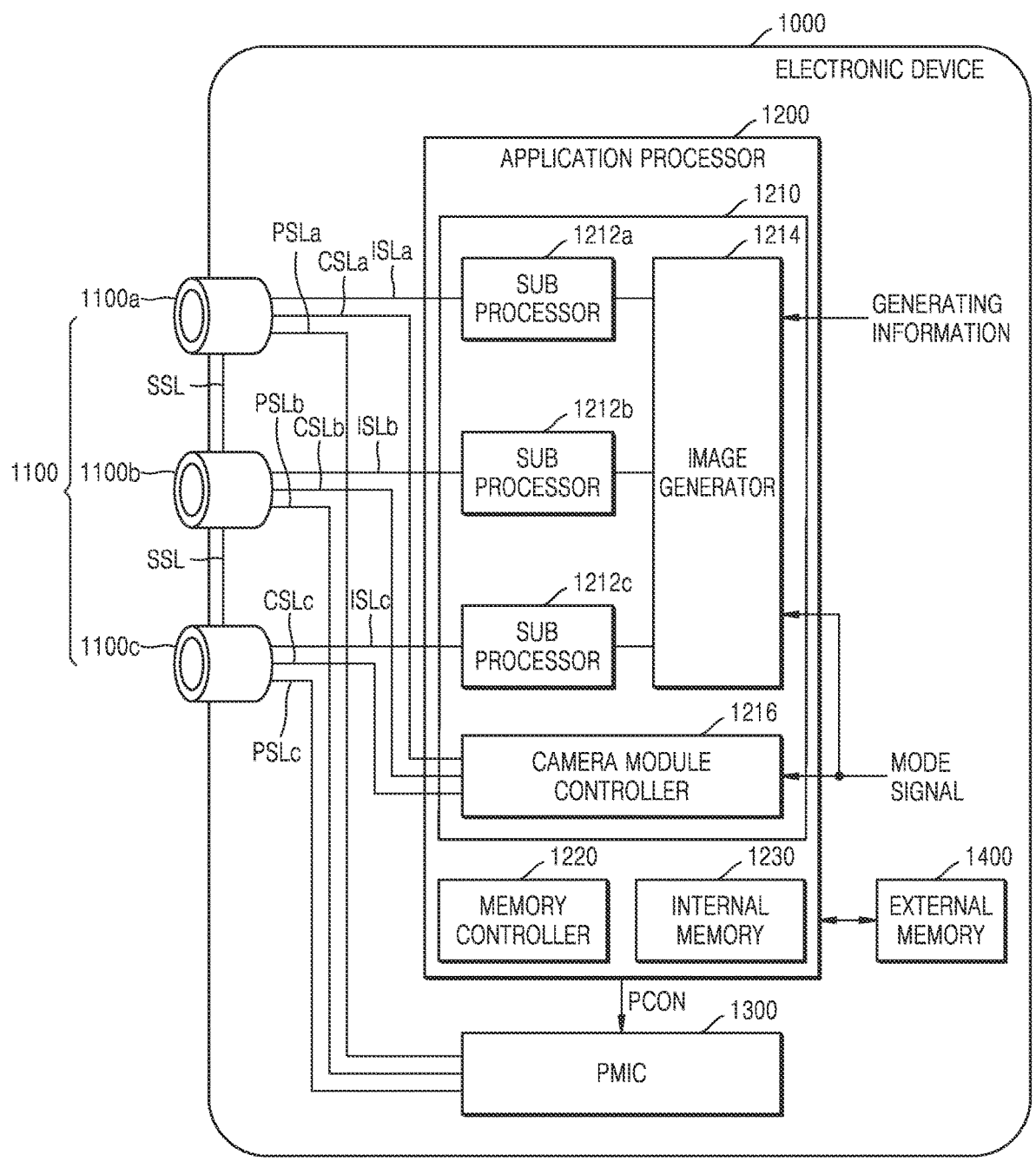
FIG. 14A illustrates a block diagram of an electronic system according to embodiments of the inventive concepts.
Figure 14B:
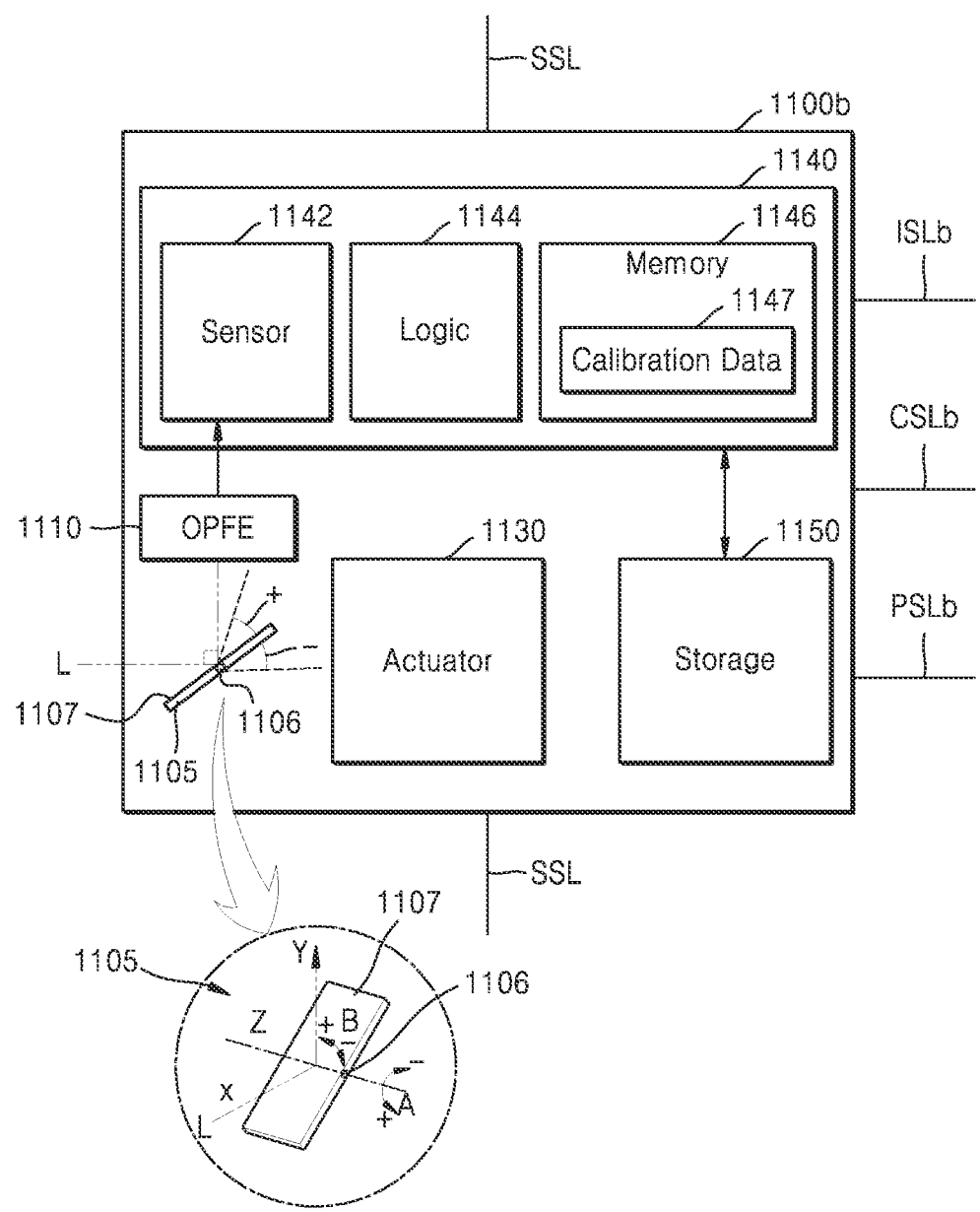
FIG. 14B illustrates a detailed block diagram of a camera module included in the electronic system of FIG. 14A.

FIG. 14A illustrates a block diagram of an electronic system 1000 according to embodiments of the inventive concepts. FIG. 14B illustrates a detailed block diagram of a camera module included in the electronic system 1000 of FIG. 14A.

Referring to FIG. 14A, the electronic system 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in FIG. 9, the inventive concepts are not limited thereto. In some embodiments, the camera module group 1100 may be modified to include only two camera modules. In some embodiments, the camera module group 1100 may be modified to include "n" camera modules, where "n" is a natural number of at least 4.

The detailed configuration of the camera module 1100b will be described with reference to FIG. 14B below. The descriptions below may also be applied to the other camera modules 1100a and 1100c.

Referring to FIG. 14B, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some embodiments, the prism 1105 may change the path of the light L incident in a first direction (an X direction in FIG. 14B) into a second direction (a Y direction in FIG. 14B) perpendicular to the first direction. The prism 1105 may rotate the reflective surface 1107 of the light reflecting material in a direction A around a central shaft 1106, or rotate the central shaft 1106 in a direction B to change the path of the light L incident in the first direction (the X direction) into the second direction (the Y direction) perpendicular to the first direction (the X direction). In this case, the OPFE 1110 may move in a third direction (a Z direction in FIG. 14B), which is perpendicular to the first direction (the X direction) and the second direction (the Y direction).

In some embodiments, as illustrated in FIG. 14B, an A-direction maximum rotation angle of the prism 1105 may be less than or equal to 15 degrees in a plus (+) A direction and greater than 15 degrees in a minus (□) A direction. However, the inventive concepts are not limited thereto.

In some embodiments, the prism 1105 may move by an angle of about 20 degrees, or in a range from about 10 degrees to about 20 degrees, or from about 15 degrees to about 20 degrees in a plus or minus B direction. In this case, an angle by which the prism 1105 moves in the plus B direction may be the same as or similar, within a difference of about 1 degree, to an angle by which the prism 1105 moves in the minus B direction.

In some embodiments, the prism 1105 may move the reflective surface 1107 of the light reflecting material in the third direction (the Z direction) parallel with an extension direction of the central shaft 1106.

The OPFE 1110 may include, for example, "m" optical lenses, where "m" is a natural number. The "m" lenses may move in the second direction (the Y direction) and change an optical zoom ratio of the camera module 1100b. For example, when the default optical zoom ratio of the camera module 1100b is Zr, the optical zoom ratio of the camera module 1100b may be changed to 3Zr or 5Zr or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, control logic 1144, and a memory 1146. In an embodiment, the control logic 1144 may be a control logic circuit. The image sensor 1142 may sense an image of an object using the light L provided through the optical lens. The control logic 1144 may control all operations of the camera module 1100b. For example, the control logic 1144 may control operation of the camera module 1100b according to a control signal provided through a control signal line CSLb.

The memory 1146 may store information, such as calibration data 1147, necessary for the operation of the camera module 1100b. The calibration data 1147 may include information, which is necessary for the camera module 1100b to generate image data using the light L provided from outside. For example, the calibration data 1147 may include information about the degree of rotation, information about a focal length, information about an optical axis, or the like. When the camera module 1100b is implemented as a multistate camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, although the storage 1150 may include electrically erasable programmable read-only memory (EEPROM), the inventive concepts are not limited thereto.

The image sensor 1142 may include the image sensor 100, 200, 300, 400, 100A, 100B, 100C, 100D, 100E, 100F, or 100G described with reference to FIGS. 1 to 13B, or an image sensor variously modified and changed therefrom within the scope of the inventive concepts.

Referring to FIGS. 14A and 14B, in some embodiments, each of the camera modules 1100a, 1100b, and 1100c may include an actuator such as the actuator 1130. Accordingly, the camera modules 1100a, 1100b, and 1100c may include calibration data 1147, which is the same or different among the camera modules 1100a, 1100b, and 1100c according to the operation of the actuator 1130 included in each of the camera modules 1100a, 1100b, and 1100c.

In some embodiments, one (e.g., the camera module 1100b) of the camera modules 1100a, 1100b, and 1100c may be of a folded-lens type including the prism 1105 and the OPFE 1110, while the other camera modules (e.g., the camera modules 1100a and 1100c) may be of a vertical type that does not include the prism 1105 and the OPFE 1110. However, the inventive concepts are not limited thereto.

In some embodiments, one (e.g., the camera module 1100c) of the camera modules 1100a, 1100b, and 1100c may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100a or 1100b).

In some embodiments, at least two camera modules (e.g., 1100a and 1100b) among the camera modules 1100a, 1100b, and 1100c may have different fields-of-view. In this case, for example, the two camera modules (e.g., 1100a and 1100b) among the camera modules 1100a, 1100b, and 1100c may respectively have different optical lenses. However, the inventive concepts are not limited thereto.

In some embodiments, the camera modules 1100a, 1100b, and 1100c may have different fields-of-view from one another. In this case, although the camera modules 1100a, 1100b, and 1100c may respectively have different optical lenses, the inventive concepts are not limited thereto.

In some embodiments, the camera modules 1100a, 1100b, and 1100c may be physically separated from one another. In other words, the sensing area of the image sensor 1142 is not divided and used by the camera modules 1100a, 1100b, and 1100c, but an image sensor such as the image sensor 1142 may be independently included in each of the camera modules 1100a, 1100b, and 1100c.

Referring back to FIG. 14A, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips.

The image processing unit 1210 may include a plurality of sub-processors 1212a, 1212b, and 1212c, an image generator 1214, and a camera module controller 1216. The image processing unit 1210 may include as many sub-processors 1212a, 1212b, and 1212c as the camera modules 1100a, 1100b, and 1100c.

Pieces of image data respectively generated by the camera modules 1100a, 1100b, and 1100c may be respectively provided to the sub-processors 1212a, 1212b, and 1212c through image signal lines ISLa, ISLb, and ISLc separated from each other. For example, image data generated by the camera module 1100a may be provided to the sub-processor 1212a through the image signal line ISLa, image data generated by the camera module 1100b may be provided to the sub-processor 1212b through the image signal line ISLb, and image data generated by the camera module 1100c may be provided to the sub-processor 1212c through the image signal line ISLc. Such image data transmission may be performed using, for example, a mobile industry processor interface (MIPI®) based camera serial interface (CSI). However, the inventive concepts are not limited thereto.

In some embodiments, a single sub-processor may be provided as an integrated sub-processor for a plurality of camera modules. For example, differently from FIG. 14A, the sub-processors 1212a and 1212c may not be separated but may be integrated into a single sub-processor, and the image data provided from the camera module 1100a or the camera module 1100c may be selected by a selection element (e.g., a multiplexer) and then provided to the integrated sub-processor.

The image data provided to each of the sub-processors 1212a, 1212b, and 1212c may be provided to the image generator 1214. The image generator 1214 may generate an output image using the image data provided from each of the sub-processors 1212a, 1212b, and 1212c according to image generation information or a mode signal.

In detail, the image generator 1214 may generate the output image by merging at least portions of respective pieces of image data, which are respectively generated by the camera modules 1100a, 1100b, and 1100c having different fields-of-view, according to the image generation information or the mode signal. Alternatively, the image generator 1214 may generate the output image by selecting one of pieces of image data, which are respectively generated by the camera modules 1100a, 1100b, and 1100c having different fields-of-view, according to the image generation information or the mode signal.

In some embodiments, the image generation information may include a zoom signal or a zoom factor. In some embodiments, the mode signal may be based on a mode selected by a user.

When the image generation information includes a zoom signal or a zoom factor and the camera modules 1100a, 1100b, and 1100c have different fields-of-view, the image generator 1214 may perform different operations according to different kinds of zoom signals. For example, when the zoom signal is a first signal, the image generator 1214 may merge image data output from the camera module 1100a and image data output from the camera module 1100c, and then generate an output image by using a merged image signal and image data output from the camera module 1100b not used for merging. When the zoom signal is a second signal different from the first signal, the image generator 1214 may generate an output image by selecting one of the pieces of image data respectively output from the camera modules 1100a, 1100b, and 1100c, instead of performing the merging. However, the inventive concepts are not limited thereto, and a method of processing image data may be changed whenever necessary.

In some embodiments, the image generator 1214 may receive a plurality of pieces of image data, which have different exposure times, from at least one of the sub-processors 1212a, 1212b, and 1212c and perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

One (e.g., the camera module 1100b) of the camera modules 1100a, 1100b, and 1100c may be designated as a master camera according to a mode signal or an image generation signal including a zoom signal, and the other camera modules (e.g., the camera modules 1100a and 1100c) may be designated as slave cameras. Such designation information may be included in a control signal and provided to each of the camera modules 1100a, 1100b, and 1100c through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100a is greater than that of the camera module 1100b, and the zoom factor indicates a low zoom ratio, the camera module 1100a may operate as a master and the camera module 1100b may operate as a slave. Contrarily, when the zoom factor indicates a high zoom ratio, the camera module 1100b may operate as a master and the camera module 1100a may operate as a slave.

In some embodiments, a control signal provided from the camera module controller 1216 to each of the camera modules 1100a, 1100b, and 1100c may include a sync enable signal. For example, when the camera module 1100b is a master camera and the camera module 1100a is a slave camera, the camera module controller 1216 may transmit the sync enable signal to the camera module 1100b. The camera module 1100b provided with the sync enable signal may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some embodiments, a control signal provided from the camera module controller 1216 to each of the camera modules 1100a, 1100b, and 1100c may include mode information according to the mode signal. The camera modules 1100a, 1100b, and 1100c may operate in a first operation mode or a second operation mode in relation with a sensing speed based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be 30 times or less the first speed.

The application processor 1200 may store the received image signal, i.e., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100a, 1100b, and 1100c. For example, under the control of the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. In this case, the power control signal PCON may include information about a camera module to operate in the low-power mode and a power level to be set. The same or different levels of power may be respectively provided to the camera modules 1100a, 1100b, and 1100c. The level of power may be dynamically changed.

Next, a method of manufacturing an image sensor, according to embodiments of the inventive concepts will be described.

FIGS. 15A to 15F illustrate cross-sectional views of a process sequence of a method of manufacturing an image sensor, according to embodiments of the inventive concepts. An example method for manufacturing the image sensor 100 described with reference to FIGS. 3A to 3D will be described with reference to FIGS. 15A to 15F.

Figure 15A:
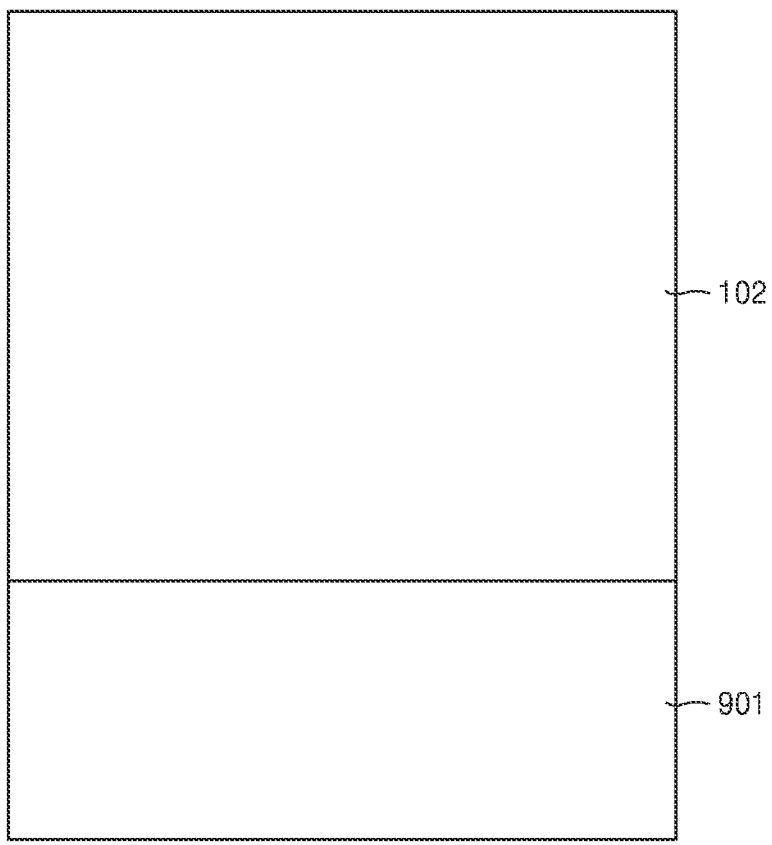
FIGS. 15A, 15B, 15C, 15D, 15E and 15F illustrate cross-sectional views of a process sequence of a method of manufacturing an image sensor, according to embodiments of the inventive concepts.

Referring to FIG. 15A, a substrate 102 including an epitaxial semiconductor layer is formed on a silicon substrate 901.

In example embodiments, the silicon substrate 901 may include single crystal silicon. The substrate 102 may include a single crystal silicon film epitaxially grown from the surface of the silicon substrate 901. In example embodiments, the silicon substrate 901 and the substrate 102 may include a single crystal silicon film doped with boron atoms (B).

Figure 15B:
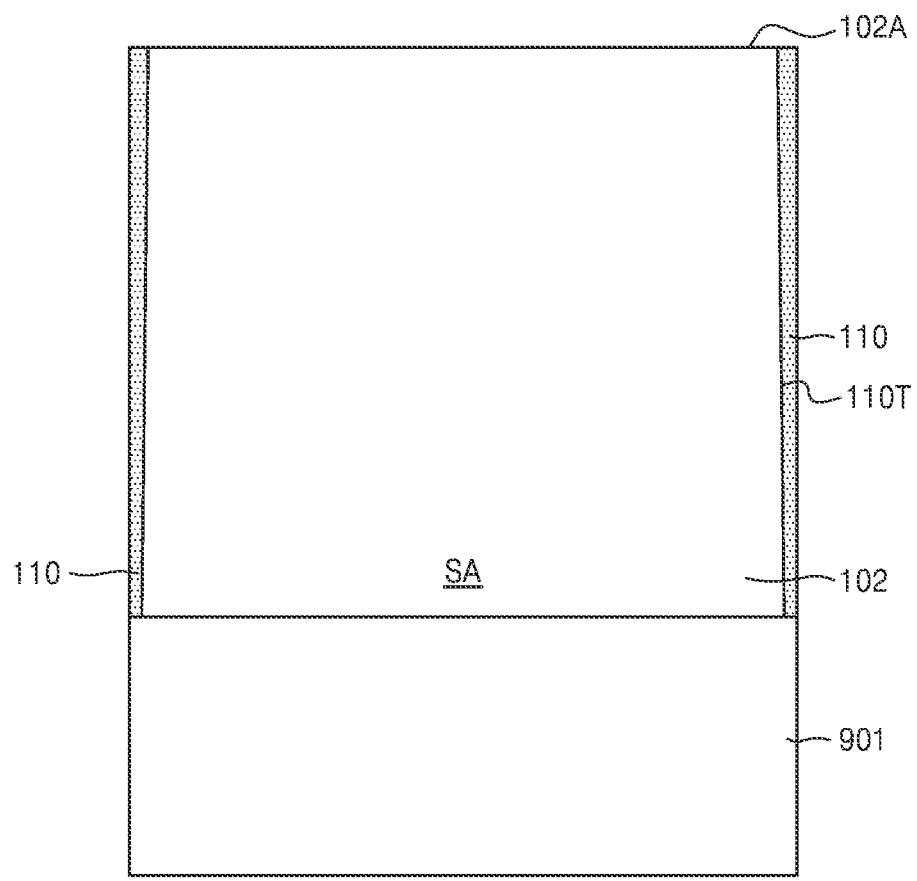

Referring to FIG. 15B, a device isolation trench 110T is formed by partially etching the substrate 102 from the front side surface 102A of the substrate 102, and then a device isolation structure 110 filling the device isolation trench 110T is formed. A sensing area SA may be defined by the device isolation structure 110.

Figure 15C:
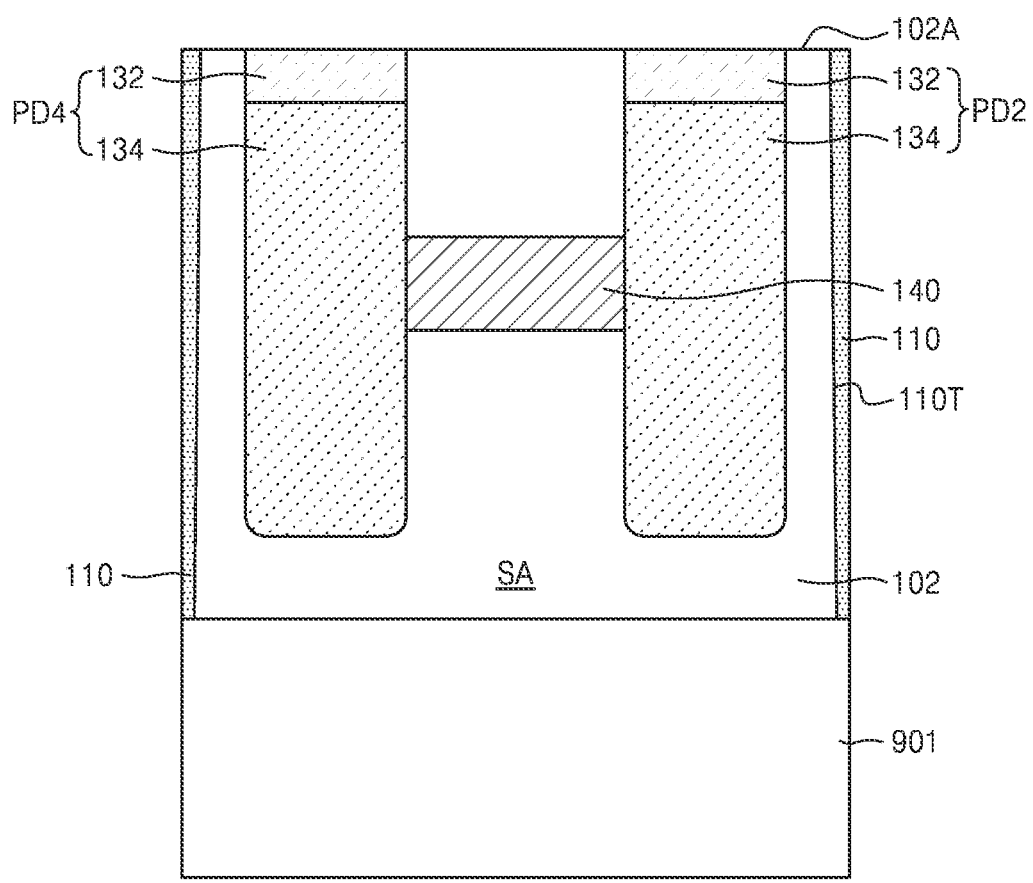

Referring to FIG. 15C, first to fourth photodiodes PD1, PD2, PD3, and PD4 and an IPO barrier 140 are formed in the sensing area SA by an ion implantation process from the front side surface 102A of the substrate 102. In example embodiments, after an ion implantation processes for forming a plurality of first semiconductor regions 132 and a plurality of second semiconductor regions 134 constituting the first to fourth photodiodes PD1, PD2, PD3, and PD4 (see FIGS. 3A to 3D) is first performed, an ion implantation process for forming the IPO barrier 140 may be performed. In other example embodiments, in order to manufacture the image sensor 300 illustrated in FIG. 5, after an ion implantation process for forming the IPO barrier 340 is first performed, an ion implantation processes for forming a plurality of first semiconductor regions 132 and a plurality of second semiconductor regions 134 constituting the first to fourth photodiodes PD1, PD2, PD3, and PD4 may be performed.

Figure 15D:
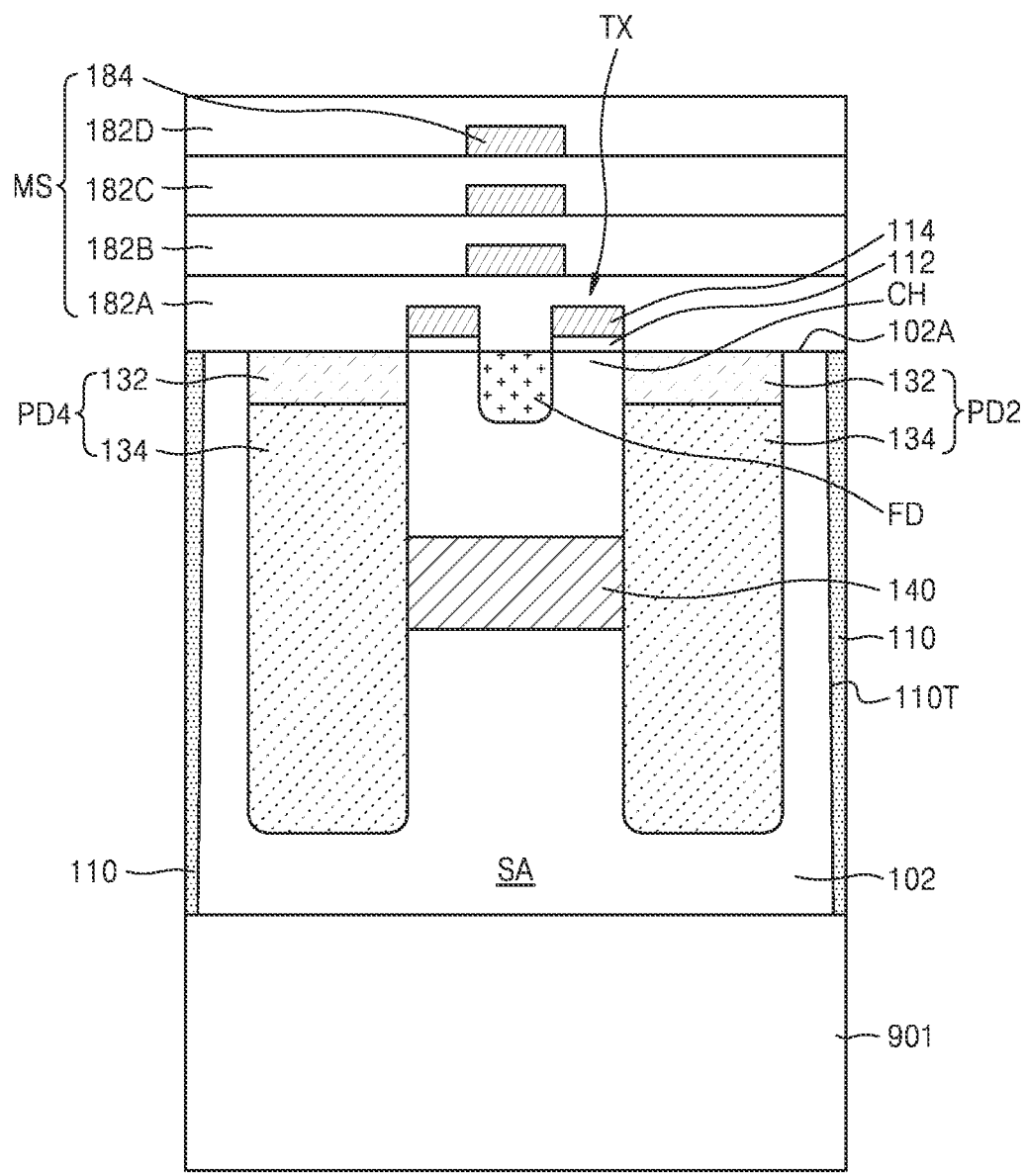

Referring to FIG. 15D, a plurality of gate structures including a gate dielectric layer 112 and a transfer gate 114 are formed on the front side surface 102A of the substrate 102, and a floating diffusion region FD is formed by implanting impurity ions into a partial region of the substrate 102 from the front side surface 102A of the substrate 102. The plurality of gate structures may include gate structures constituting the first to fourth transfer transistors TX1, TX2, TX3, and TX4, the reset transistors RX, the source follower transistors SF, and the selection transistors SX described with reference to FIG. 2. Then, a wiring structure MS including interlayer insulating layers 182A, 182B, 182C, and 182D of a multilayer structure and a plurality of wiring layers 184 of a multilayer structure may be formed on the plurality of gate structures.

In the present example, only a partial region of the pixel unit PXU in the substrate 102 is illustrated, but the substrate 102 may further include a plurality of pixel units PXU described with reference to FIG. 1, and a peripheral circuit area (not shown) and a pad area (not shown) that are arranged around the plurality of pixel units PXU. The peripheral circuit area may be an area including various types of circuits for controlling the plurality of pixel units PXU. For example, the peripheral circuit area may include a plurality of transistors, and the plurality of transistors may be driven to provide a certain signal to each of the first to fourth photodiodes PD1, PD2, PD3, and PD4, or control an output signal from each of the fourth photodiodes PD1, PD2, PD3, and PD4. For example, the plurality of transistors may constitute various types of logic circuits such as a timing generator, a row decoder, a row driver, a CDS, an ADC, a latch, and a column decoder. The pad area may include conductive pads electrically connected to the plurality of pixel units PXU and the circuits in the peripheral circuit area. The conductive pads may function as connection terminals for supplying power and signals to the plurality of pixel units PXU and the circuits in the peripheral circuit area from the outside.

Figure 15E:
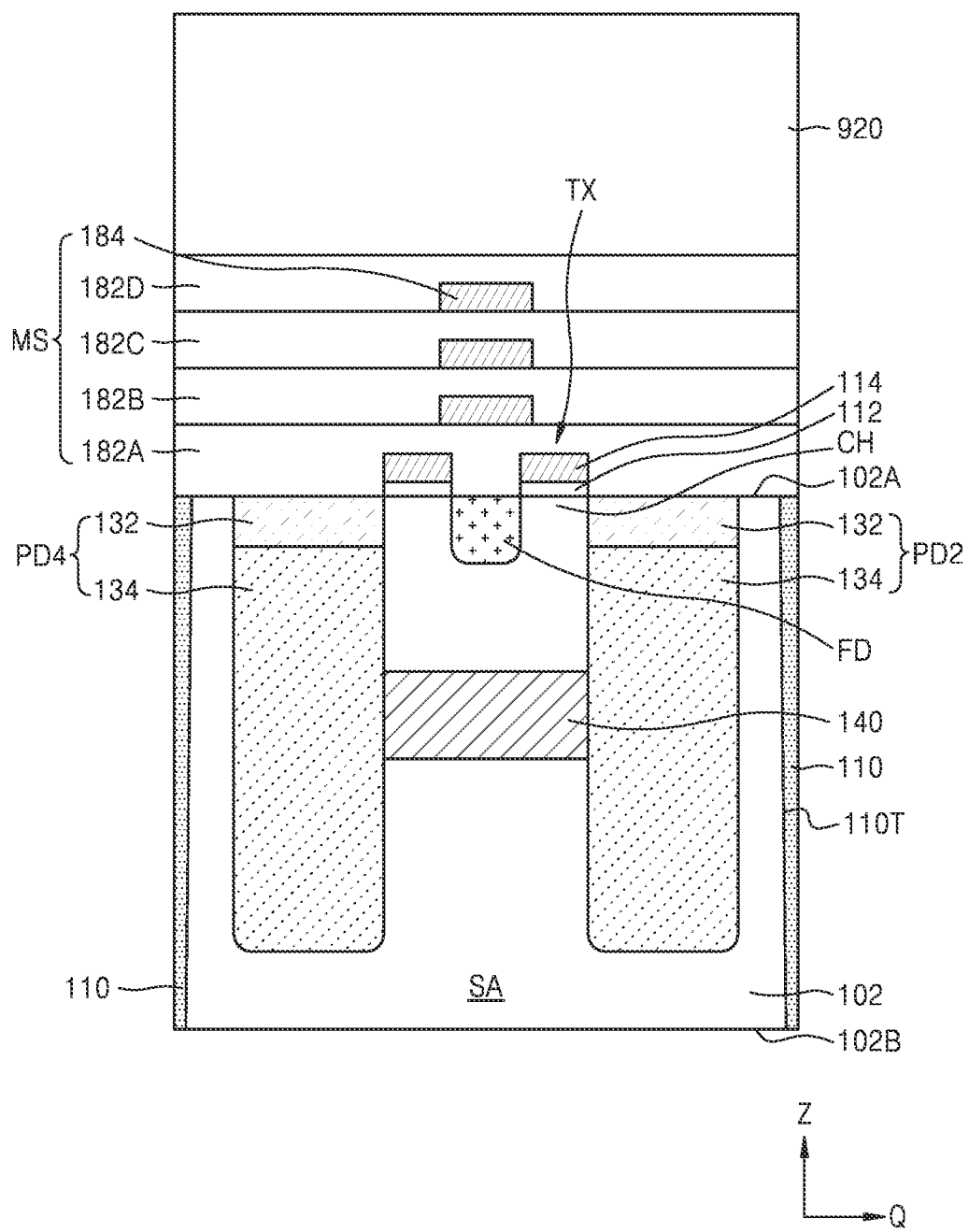

Referring to FIG. 15E, a support substrate 920 may be adhered on the wiring structure MS. An adhesive layer (not shown) may be between the support substrate 920 and the interlayer insulating layer 182D. Then, in a state in which the support substrate 920 is adhered on the wiring structure MS, the silicon substrate 901 may be removed using a mechanical grinding process, a chemical mechanical polishing (CMP) process, a wet etching process, or a combination thereof to thereby expose the backside surface 102B of the substrate 102.

Figure 15F:
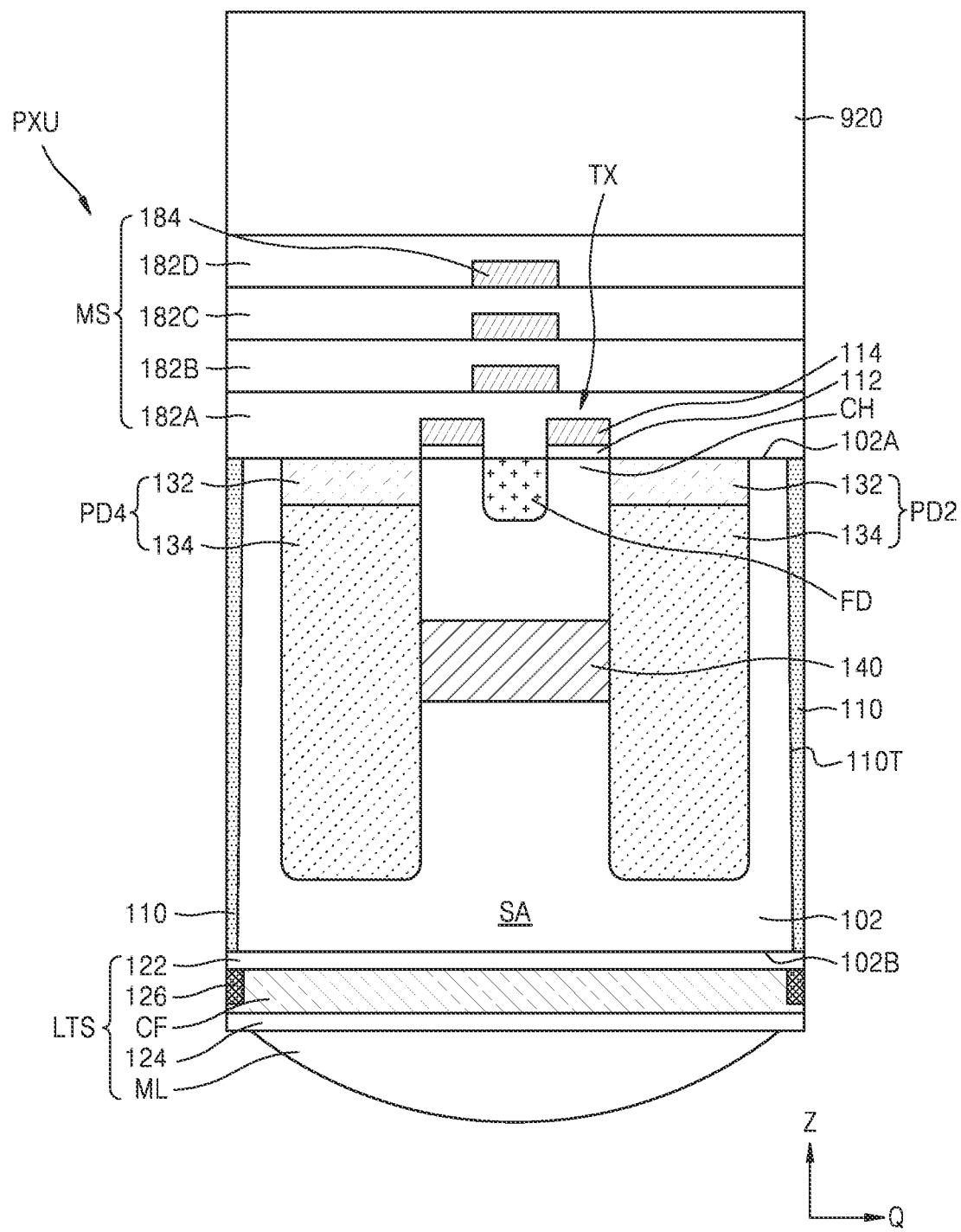

Referring to FIG. 15F, a first planarization layer 122, an anti-reflection layer 126, a color filter CF, a second planarization layer 124, and a microlens ML may be sequentially formed on the back side surface 102B of the substrate 102 and the device isolation structure 110 to thereby form a light-transmitting structure LTS. After that, the support substrate 920 may be removed to manufacture the image sensor 100 illustrated in FIGS. 3A to 3D.

According to the method of manufacturing an image sensor described with reference to FIGS. 15A to 15F, the IPO barrier 140 is formed to be arranged in a substantially central portion of the sensing area SA and to be connected to each of the first to fourth photodiodes PD1, PD2, PD3, and PD4 in the pixel unit PXU. In addition, the IPO barrier 140 is formed at a position vertically spaced from the front side surface 102A of the substrate 102 with the floating diffusion region FD therebetween. Therefore, a process for forming the IPO barrier 140 is easy, and as the IPO barrier 140 maintains a sufficient separation distance in the vertical direction (Z direction) from electrodes constituting the image sensor 100, in particular, from the transfer gate 114 of each of the first to fourth transfer transistors TX1, TX2, TX3, and TX4, an FWC in the first to fourth photodiodes PD1, PD2, PD3, and PD4 may be easily increased without electrical interference between the electrodes included in the image sensor 100 and the IPO barrier 140. Accordingly, the image sensor 100 may provide excellent sensitivity and color quality.

In addition, because the IPO barrier 140 is formed in an approximately central region of the sensing area SA of the pixel unit PXU, the planar size of the IPO barrier 140 may be relatively large. Accordingly, during an ion implantation process for forming the IPO barrier 140, process difficulty may be reduced, and the distribution of concentration of dopants included in the IPO barrier 140 may be improved.

Although the method of manufacturing the image sensor 100 illustrated in FIGS. 3A to 3D has been described with reference to FIGS. 15A to 15F, various modifications and changes may be made within the scope of the inventive concepts to manufacture the image sensors 200, 300, 400, 100A, 100B, 100C, 100D, 100E, 100F, and 100G described above with reference to FIGS. 4 to 13B and image sensors variously modified and changed therefrom within the scope of the inventive concepts.

While the inventive concepts have been particularly shown and described with reference to embodiments thereof, it should be understood that various changes in form and details may be made therein without departing from the spirit and scope of the following claims.

What is claimed is:
1. An image sensor comprising:
a substrate having a sensing area;
a floating diffusion region arranged in the sensing area;
a plurality of photodiodes arranged around the floating diffusion region in the sensing area, wherein each of the plurality of photodiodes includes a first semiconductor region and a second semiconductor region; and
an inter-pixel overflow (IPO) barrier in contact with each of the plurality of photodiodes, wherein the IPO barrier includes a third semiconductor region in contact with the second semiconductor region of each of the plurality of photodiodes, the third semiconductor region having a same conductivity type as the second semiconductor region of each of the plurality of photodiodes, and the IPO barrier overlapping the floating diffusion region in a vertical direction at a position vertically spaced apart from the floating diffusion region within the sensing area.

2. The image sensor of claim 1, wherein the first semiconductor region of each of the plurality of photodiodes is arranged adjacent to a front side surface of the substrate and is doped with first conductivity type impurities, and the second semiconductor region of each of the plurality of photodiodes is doped with second conductivity type impurities and is in contact with the first semiconductor region of each of the plurality of photodiodes at a position spaced apart from the front side surface, the first semiconductor region of each of the plurality of photodiodes disposed between the front side surface and the second semiconductor region of each of the plurality of photodiodes,
wherein the third semiconductor region is doped with the second conductivity type impurities, and
wherein the second semiconductor region of each of the plurality of photodiodes has a first doping concentration, and the third semiconductor region has a second doping concentration less than the first doping concentration.

3. The image sensor of claim 1, further comprising:
a plurality of transfer transistors sharing the floating diffusion region,
wherein each of the plurality of transfer transistors includes a transfer gate arranged on the substrate, and
the IPO barrier is spaced apart from the transfer gate in the vertical direction with the floating diffusion region therebetween.

4. The image sensor of claim 1, wherein the substrate includes a front side surface adjacent to the floating diffusion region, and a back side surface opposite to the front side surface, wherein the IPO barrier is arranged at a position spaced apart from the front side surface and the back side surface.

5. The image sensor of claim 1, further comprising:
a device isolation structure defining the sensing area in the substrate,
wherein the IPO barrier is arranged at a position horizontally spaced apart from the device isolation structure, and the plurality of photodiodes are arranged between the IPO barrier and the device isolation structure.

6. The image sensor of claim 1, wherein the IPO barrier has a plurality of contact surfaces in contact with the plurality of photodiodes, and areas of the plurality of contact surfaces are the same.

7. The image sensor of claim 1, wherein the IPO barrier has a plurality of contact surfaces in contact with the plurality of photodiodes, and the plurality of contact surfaces include at least two contact surfaces having different areas.

8. The image sensor of claim 1, wherein, in the vertical direction, a first separation distance between the floating diffusion region and the IPO barrier is less than a second separation distance between a bottommost level of the plurality of photodiodes and the IPO barrier, the bottommost level being a level of the plurality of photodiodes that is farthest from the floating diffusion region.

9. The image sensor of claim 1, wherein, in the vertical direction, a first separation distance between the floating diffusion region and the IPO barrier is greater than a second separation distance between a bottommost level of the plurality of photodiodes and the IPO barrier, the bottommost level being a level of the plurality of photodiodes that is farthest from the floating diffusion region.

10. The image sensor of claim 1, wherein the substrate includes a front side surface adjacent to the floating diffusion region, and a back side surface opposite to the front side surface,
the image sensor further comprising a microlens covering the sensing area on the back side surface of the substrate,
wherein the floating diffusion region, the plurality of photodiodes, and the IPO barrier vertically overlap the microlens.

11. The image sensor of claim 1, further comprising:
a device isolation structure defining the sensing area in the substrate, wherein the device isolation structure has a planar structure having a closed loop shape surrounding the floating diffusion region, the plurality of photodiodes, and the IPO barrier.

12. The image sensor of claim 1, further comprising:
a device isolation structure defining the sensing area in the substrate; and
at least one inner device isolation structure passing through at least a portion of the substrate within the sensing area,
wherein the at least one inner device isolation structure is arranged in at least one of a plurality of regions between each of the plurality of photodiodes.

13. An image sensor comprising:
a substrate having a front side surface and a back side surface opposite to each other, and a sensing area between the front side surface and the back side surface;
a floating diffusion region arranged adjacent to the front side surface in the sensing area;
a plurality of transfer gates arranged around the floating diffusion region on the sensing area;

a plurality of channel regions located under the plurality of transfer gates in the sensing area;
a plurality of photodiodes arranged in the sensing area around the floating diffusion region and adjacent to the front side surface, the plurality of photodiodes spaced apart from the floating diffusion region, and the plurality of channel regions arranged between the plurality of photodiodes and the floating diffusion region, wherein each of the plurality of photodiodes includes a first semiconductor region and a second semiconductor region;
an inter-pixel overflow (IPO) barrier arranged at a position vertically spaced apart from the floating diffusion region within the sensing area and overlapping the floating diffusion region in a vertical direction, the IPO barrier having a plurality of contact surfaces respectively in contact with the plurality of photodiodes, wherein the IPO barrier includes a third semiconductor region in contact with the second semiconductor region of each of the plurality of photodiodes, and the third semiconductor region has a same conductivity type as the second semiconductor region of each of the plurality of photodiodes; and
a microlens covering the back side surface.

14. The image sensor of claim 13, wherein each of the plurality of contact surfaces of the IPO barrier is a convex contact surface facing toward a photodiode from among the plurality of photodiodes.

15. The image sensor of claim 13, wherein each of the plurality of contact surfaces of the IPO barrier is a concave contact surface facing toward a photodiode from among the plurality of photodiodes.

16. The image sensor of claim 13, wherein, in the vertical direction, a first separation distance between the front side surface and the IPO barrier is less than a second separation distance between the IPO barrier and the back side surface.

17. The image sensor of claim 13, wherein, in the vertical direction, a first separation distance between the front side surface and the IPO barrier is greater than a second separation distance between the IPO barrier and the back side surface.

18. The image sensor of claim 13, further comprising:
a device isolation structure defining the sensing area in the substrate,
wherein the plurality of photodiodes are arranged between the IPO barrier and the device isolation structure.

19. The image sensor of claim 13, wherein the floating diffusion region, the plurality of transfer gates, the plurality of photodiodes, and the IPO barrier vertically overlap the microlens.

20. An electronic system comprising:
at least one camera module including an image sensor; and
a processor configured to process image data provided from the at least one camera module,
wherein the image sensor comprises
a substrate having a sensing area,
a floating diffusion region arranged in the sensing area,
a plurality of photodiodes arranged around the floating diffusion region in the sensing area, wherein each of the plurality of photodiodes includes a first semiconductor region and a second semiconductor region, and
an inter-pixel overflow (IPO) barrier in contact with each of the plurality of photodiodes, wherein the IPO barrier includes a third semiconductor region in contact with the second semiconductor region of each of the plurality of photodiodes, the third semiconductor region having a same conductivity type as the second semiconductor region of each of the plurality of photodiodes, and the IPO barrier overlapping the floating diffusion region in a vertical direction at a position vertically spaced apart from the floating diffusion region within the sensing area.

* * * * *